United States Patent
Van Brunt et al.

(10) Patent No.: US 11,791,378 B2
(45) Date of Patent: Oct. 17, 2023

(54) SUPERJUNCTION POWER SEMICONDUCTOR DEVICES FORMED VIA ION IMPLANTATION CHANNELING TECHNIQUES AND RELATED METHODS

(71) Applicant: Wolfspeed, Inc., Durham, NC (US)

(72) Inventors: Edward Robert Van Brunt, Raleigh, NC (US); Alexander V. Suvorov, Durham, NC (US); Vipindas Pala, Morrisville, NC (US); Daniel J. Lichtenwalner, Raleigh, NC (US); Qingchun Zhang, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/371,514

(22) Filed: Jul. 9, 2021

(65) Prior Publication Data
US 2021/0367029 A1 Nov. 25, 2021

Related U.S. Application Data

(63) Continuation of application No. 15/168,310, filed on May 31, 2016, now Pat. No. 11,075,264.

(51) Int. Cl.
*H01L 29/06* (2006.01)
*H01L 29/16* (2006.01)
(Continued)

(52) U.S. Cl.
CPC ........ *H01L 29/0634* (2013.01); *H01L 21/047* (2013.01); *H01L 29/045* (2013.01);
(Continued)

(58) Field of Classification Search
CPC ............... H01L 29/0634; H01L 29/045; H01L 29/1095; H01L 29/1608; H01L 29/808
(Continued)

(56) References Cited

U.S. PATENT DOCUMENTS

| 6,313,482 B1 | 11/2001 | Baliga |
| 2001/0046739 A1 | 11/2001 | Miyasaka et al. |

(Continued)

FOREIGN PATENT DOCUMENTS

| CN | 105118352 A | 12/2015 |
| JP | 2002203963 A | 7/2002 |

(Continued)

OTHER PUBLICATIONS

"Extended European Search Report for European Application No. 21194403.8, dated Dec. 10, 2021, 11 pages".
(Continued)

*Primary Examiner* — Matthew E. Gordon
(74) *Attorney, Agent, or Firm* — Myers Bigel, P.A.

(57) ABSTRACT

Semiconductor devices include a silicon carbide drift region having an upper portion and a lower portion. A first contact is on the upper portion of the drift region and a second contact is on the lower portion of the drift region. The drift region includes a superjunction structure that includes a p-n junction that is formed at an angle of between 10° and 30° from a plane that is normal to a top surface of the drift region. The p-n junction extends within +/−1.5° of a crystallographic axis of the silicon carbide material forming the drift region.

18 Claims, 17 Drawing Sheets

(51) Int. Cl.
    | | |
    |---|---|
    | *H01L 29/04* | (2006.01) |
    | *H01L 29/66* | (2006.01) |
    | *H01L 29/872* | (2006.01) |
    | *H01L 21/04* | (2006.01) |
    | *H01L 29/78* | (2006.01) |
    | *H01L 29/10* | (2006.01) |

(52) U.S. Cl.
    CPC ...... *H01L 29/0619* (2013.01); *H01L 29/1608* (2013.01); *H01L 29/6606* (2013.01); *H01L 29/7802* (2013.01); *H01L 29/872* (2013.01); *H01L 29/0692* (2013.01); *H01L 29/1095* (2013.01)

(58) Field of Classification Search
    USPC .......................................................... 257/77
    See application file for complete search history.

(56) References Cited

U.S. PATENT DOCUMENTS

| | | | |
|---|---|---|---|
| 2008/0303114 | A1 | 12/2008 | Shibata et al. |
| 2011/0068397 | A1 | 3/2011 | Disney |
| 2011/0248335 | A1 | 10/2011 | Higashida |
| 2012/0098064 | A1 | 4/2012 | Onishi |
| 2013/0037852 | A1 | 2/2013 | Tamaki |
| 2014/0191309 | A1 | 7/2014 | Eguchi et al. |
| 2014/0264477 | A1* | 9/2014 | Bhalla ............... H01L 29/66909 438/192 |
| 2015/0028350 | A1* | 1/2015 | Suvorov ............ H01L 29/7802 257/77 |
| 2016/0104768 | A1 | 4/2016 | Willmeroth et al. |
| 2016/0190301 | A1 | 6/2016 | Aichinger et al. |
| 2016/0233295 | A1* | 8/2016 | Schulze ............... H01L 21/266 |

FOREIGN PATENT DOCUMENTS

| | | |
|---|---|---|
| JP | 2005175416 A | 6/2005 |
| WO | 2015013620 A1 | 1/2015 |

OTHER PUBLICATIONS

"Translation of Japanese Office Action, for corresponding Japanese Application No. 2018-562539, dated Aug. 13, 2021".

Averback, R.S., & de la Rubia, T.D. (1997) "Displacement Damage in Irradiated Metals and Semiconductors", Solid State Physics—Advances in Research and Applications, 51(C), 281-402, https://doi.org/10.1016/S0081-1947(08) 60193-9 (Year: 1997).

Examination Report issued in corresponding European Application No. 17714084.5, dated Feb. 11, 2020 (5 pages).

Fujihira Tatsuhiko, "Theory of Semiconductor Superjunction Devices", Japanese Journal of Applied Physics 36, Part 1, No. 10 (1997): 6254-6262.

Wong-Leung J. et al., "Effect of Crystal Orientation on the Implant Profile of 60 keV Al into 4H-SiC Crystals", Journal of Applied Physics, American Institute of Physics, US, vol. 93, No. 11, pp. 8914-8917.

Janson, Martin, "Hydrogen Diffusion and Ion Implantation in Silicon Carbide", KTH Royal Institute of Technology, Materials and Semiconductor Physics, Stockholm 2003.

Kosugi et al., "Development of SiC Super-Junction (SJ) Device by Deep Trench-Filling Epitaxial Growth", Trans Tech Publications, Switzerland, Materials Science Forum vols. 740-742 (2013) pp. 785-788.

Kosugi et al., "First Experimental Demonstration of SiC Super-Junction (SJ) Structure by Multi-Epitaxial Growth Method", IEEE Proceedings of the 26th International Symposium of Power Semiconductor Devices & IC's Jun. 15-29, 2014, Waikoloa, Hawaii, pp. 346-349.

Li, Zhongda; Naik, Harsh and Chow, T. Paul, "Design of GaN and SiC 5-20kV Vertical Superjunction Structures", Center for Integrated Electronics, Rensselaer Polytechnic Institute, 2012 IEEE.

Morvan E., et al., "Channeling Implantations of Al+ into 6H Silicon Carbide", Applied Physics Letters, AIP Publishing LLCC, US, vol. 74, No. 26, pp. 3990-3992.

Notification of Transmittal of the International Search Report and the Written Opinion of the International Searching Authority, or the Declaration, for International Application No. PCT/US2017/022240, dated May 29, 2017.

Office Action dated Jan. 5, 2021, for corresponding Japanese Patent Application No. 2018-562539, including English translation.

Shiyang Tian, "Monte Carlos Simulation of Ion Implantation in Crystalline SiC with Arbitrary Polytypes", IEEE Transactions no Electron Devices, IEEE Service Center, Pisacataway NJ, US, vol. 55, No. 8, pp. 1991-1996.

* cited by examiner

View of Lattice Along the <0001> Crystallographic Axis

View of Lattice Along the <11-23> Crystallographic Axis

View of Lattice Along the <11-20> Crystallographic Axis

SUPERJUNCTION POWER SEMICONDUCTOR DEVICES FORMED VIA ION IMPLANTATION CHANNELING TECHNIQUES AND RELATED METHODS

CROSS-REFERENCE TO RELATED APPLICATIONS

The present application is a continuation of, and claims priority to, U.S. patent application Ser. No. 14/168,310, filed on May 31, 2016, the disclosure of which is incorporated herein in its entirety by reference.

STATEMENT OF U.S. GOVERNMENT INTEREST

This invention was made with Government support under Contract No. W911 NF-12-2-0064 awarded by the Army Research Laboratory. The Government has certain rights in the invention.

FIELD OF THE INVENTION

The present invention relates to power semiconductor devices and, more particularly, to power semiconductor devices having superjunction structures and to methods of fabricating such devices.

BACKGROUND

Power semiconductor devices are used to carry large currents and support high voltages. A wide variety of power semiconductor devices are known in the art including, for example, power Metal Oxide Semiconductor Field Effect Transistors ("MOSFET"), bipolar junction transistors ("BJTs"), Insulated Gate Bipolar Transistors ("IGBT"), Schottky diodes, Junction Barrier Schottky ("JBS") diodes, merged p-n Schottky ("MPS") diodes, Gate Turn-Off Transistors ("GTO"), MOS-controlled thyristors and various other devices. These power semiconductor devices are generally fabricated from monocrystalline silicon semiconductor material, or, more recently, from silicon carbide or gallium nitride based semiconductor materials.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers such as semiconductor substrates and/or semiconductor epitaxial layers.

A conventional silicon carbide power device typically has a silicon carbide substrate, such as a silicon carbide wafer having a first conductivity type (e.g., an n-type substrate), on which an epitaxial layer structure having the first conductivity type (e.g., n-type) is formed. This epitaxial layer structure (which may comprise one or more separate layers) functions as a drift region of the power semiconductor device. The device typically includes an "active region" which includes one or more power semiconductor devices that have a p-n junction and/or a Schottky junction. The active region may be formed on and/or in the drift region. The active region acts as a main junction for blocking voltage in the reverse bias direction and providing current flow in the forward bias direction. The device may also have an edge termination region adjacent the active region. One or more power semiconductor devices may be formed on the substrate, and each power semiconductor device will typically have its own edge termination. After the substrate is fully formed and processed, the substrate may be diced to separate the individual edge-terminated power semiconductor devices if multiple devices are formed on the same substrate. The power semiconductor devices may have a unit cell structure in which the active region of each power semiconductor device includes a large number of individual devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. However, current leakage can occur for other reasons, such as failure of the edge termination and/or the primary junction of the device. If the voltage on the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the design breakdown voltage of the device. In particular, leakage current may begin to flow at the edges of the active region, where high electric fields may be experienced due to electric field crowding effects. In order to reduce this electric field crowding (and the resulting increased leakage currents), edge termination structures may be provided that surround part or all of the active region of a power semiconductor device. These edge terminations may spread the electric field out over a greater area, thereby reducing the electric field crowding.

In vertical power semiconductor devices, the blocking voltage rating of the device is typically determined by the thickness and the doping concentration of the drift region. In particular, to increase the breakdown voltage of the device, the doping concentration of the drift region is decreased and/or the thickness of the drift region is increased. Typically, during the design phase, a desired blocking voltage rating is selected, and then the thickness and doping of the drift region are chosen based on the desired blocking voltage rating. Since the drift region is the current path for the device in the forward "on" state, the decreased doping concentration and increased thickness of the drift region may result in a higher on-state resistance for the device. Thus, there is an inherent tradeoff between the on-state resistance and blocking voltage for these devices.

Superjunction-type drift regions have been introduced in which the drift region is divided into alternating, side-by-side heavily-doped n-type and p-type regions. In vertical semiconductor devices, these side-by-side n-type and p-type regions are often referred to as "pillars." The pillars may have fin shapes, column shapes or other shapes. The thickness and doping of these pillars may be controlled so that the superjunction will act like a p-n junction with low resistance and a high breakdown voltage. Thus, by using superjunction structures, the conventional tradeoff between the breakdown voltage of the device and the doping level of the drift region may be avoided. Typically, at least some of the pillars are formed via ion implantation, and so-called "deep" implantation is used (e.g., ion implantation depths of 2.5 microns to 5 microns or more) to enhance the effect of the superjunction structure. In superjunction devices, the doping concentration in the drift region may be increased in order to reduce the on-state resistance of the device with reduced effect on the breakdown voltage.

FIG. 1 is a schematic cross-sectional diagram of a conventional power semiconductor device in the form of a JBS diode 10 that has a conventional superjunction-type drift region 30. As shown in FIG. 1, the JBS diode 10 includes a cathode contact 20, an ohmic contact layer 22, an n-type substrate 24, the drift region 30 a p-type blocking junction 40, a channel region 46, a Schottky contact 42 and an anode contact 44. The cathode contact 20 and the anode contact 44 may each comprise a highly conductive metal layer. The Schottky contact 42 may comprise a layer that forms a Schottky junction with the drift region 30 and may comprise, for example, an aluminum layer. The n-type substrate 24 may comprise a silicon carbide substrate that is heavily doped with n-type impurities such as nitrogen or phosphorous. The ohmic contact layer 22 may comprise a metal that forms an ohmic contact to n-type silicon carbide so as to form an ohmic contact to the silicon carbide substrate 24. The p-type blocking junction 40 may be a p-type implanted region in an upper portion of the drift region 30 that is heavily implanted with p-type dopants. The channel region 46 is positioned adjacent the p-type blocking junction 40. The channel region 46 is a semiconductor structure that passes current in the on-state and blocks voltage in the blocking state. Current flows through the channel region 46 when the diode 10 is in its forward on-state.

The drift region 30 may comprise a silicon carbide semiconductor region that includes at least one n-type pillar 32 and at least one p-type pillar 34. The n-type pillar 32 and the p-type pillar 34 may each comprise epitaxially grown silicon carbide regions that are doped with n-type and p-type dopants, respectively. The number of charges in the n-type pillar 32 may be approximately equal to the number of charges in the p-type pillar 34. The n-type and p-type pillars 32, 34 may be formed, for example, by implanting ions into predetermined portions of the drift region 30. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth.

SUMMARY

Pursuant to embodiments of the present invention, semiconductor devices are provided that include a drift region having an upper portion and a lower portion, the drift region comprising silicon carbide; a first contact on the upper portion of the drift region; and a second contact on the lower portion of the drift region. The drift region includes a superjunction structure that includes a p-n junction that is formed at an angle of between 6° and 35° from a plane that is normal to a top surface of the drift region. The p-n junction extends within +/−1.5° of a crystallographic axis of the silicon carbide material forming the drift region.

In some embodiments, the crystallographic axis is one of the <11-23>, <−1-123>, <1-213>, <−12-13>, <2-1-13> or <−2113> crystallographic axes. The p-n junction may comprise an interface between a p-type pillar and an n-type pillar, and a width of the p-type pillar may be approximately equal to a width of the n-type pillar. In some embodiments, the p-type and n-type pillars may each extend at least 4 microns into the drift region from an upper surface of the drift region. The p-type pillar may have a doping concentration that varies as a function of depth from an upper surface of the drift region by less than a factor of ten throughout at least a 2.5 micron deep portion of the p-type pillar.

Pursuant to further embodiments of the present invention, semiconductor devices are provided that include a drift region having an upper portion and a lower portion, the drift region comprising silicon carbide; a first contact on the upper portion of the drift region; and a second contact on the lower portion of the drift region. In these devices, the drift region may include a first pillar that is doped with first conductivity type impurities, the first pillar having a first sidewall that is slanted at an angle of between 10° and 13°, between 15.5° and 18.5°, or between 30° and 33° from the <0001> crystallographic axis and a second pillar that is doped with second conductivity type impurities that are opposite the first conductivity type impurities adjacent the first pillar.

In some embodiments, the first pillar and the second pillar may form a p-n junction in the drift region that is at least part of a superjunction structure in the drift region. The second pillar may have a first sidewall that is slanted at an angle of between 10° and 13°, between 15.5° and 18.5°, or between 30° and 33° from the <0001> crystallographic axis. The first sidewall of the first pillar may be slanted at the same angle as the first sidewall of the second pillar. The first sidewall of the first pillar may face and directly contact the first sidewall of the second pillar.

In some embodiments, the first sidewall of the first pillar may be coplanar with the first sidewall of the second pillar. A first volume of the first pillar may be approximately equal to a second volume of the second pillar. The semiconductor device may further include a silicon carbide substrate that is between the drift region and the second contact. The first conductivity type impurities may be p-type conductivity impurities and the second conductivity type impurities may be n-type conductivity impurities. The silicon carbide substrate may be is cut at an oblique angle to the plane defined by the <10-10> and <11-20> crystallographic axes such as, for example, an angle of 2° to 8°. In some embodiments, the oblique angle may be about 4°.

In some embodiments, the device may further include an edge termination that surrounds the first and second pillars. The first and second pillars may extend at least 4 microns into the drift region from an upper surface of the drift region. The drift region may have a doping concentration of, for example, from about $5 \times 10^{15}$ cm$^{-3}$ to about $5 \times 10^{16}$ cm$^{-3}$. The first pillar may have a doping concentration that varies as a function of depth from an upper surface of the drift region by less than a factor of ten throughout at least a 2.5 micron deep portion of the first pillar.

Pursuant to still further embodiments of the present invention, semiconductor devices are provided that include a drift region having an upper portion and a lower portion, the drift region comprising silicon carbide; a first contact on the upper portion of the drift region; and a second contact on the lower portion of the drift region. The drift region includes a superjunction structure that has a first pillar that is doped with first conductivity type impurities, the first pillar having a first sidewall that is slanted at an angle of between −1.5° and 1.5° from the <11-20> crystallographic axis and a second pillar that is doped with second conductivity type impurities that are opposite the first conductivity type impurities adjacent the first pillar, the second pillar having a first sidewall that is slanted at an angle of between −1.5° and 1.5° from the <11-20> crystallographic axis.

In some embodiments, the first pillar and the second pillar may have approximately the same width. The first and second pillars may extend at least 5 microns into the drift region from an upper surface of the drift region. The first pillar may have a doping concentration that varies as a function of depth from an upper surface of the drift region by less than a factor of ten throughout at least a 2.5 micron deep portion of the first pillar.

Pursuant to still other embodiments of the present invention, methods of forming a semiconductor device are provided in which a silicon carbide drift layer is formed that is doped with impurities having a first conductivity type on a silicon carbide substrate. Impurities having a second conductivity type that is opposite the first conductivity type are implanted into selected portions of the drift layer, where the impurities are implanted at an angle that is within +/−1.5° of one of the <11-23>, <−1-123>, <1-213>, <−12-13>, <2-1-13> or <−2113> crystallographic axes, to form a second conductivity type pillar within the drift layer that is part of a superjunction structure. Impurities having the first conductivity type may also be implanted into selected portions of the drift layer, wherein the impurities are implanted at an angle that is +/−1.5° of one of the <11-23>, <−1-123>, <1-213>, <−12-13>, <2-1-13> or <−2113> crystallographic axes, to form a first conductivity type pillar within the drift layer that is part of the superjunction structure and that forms a p-n junction with the second conductivity type pillar.

In some embodiments, the first and second conductivity type pillars may each have at least one slanted sidewall. The second conductivity type pillar may have at least two sidewalls that are slanted at an angle of between 10° and 13°, between 15.5° and 18.5°, or between 30° and 33° from the <0001> crystallographic axis. The silicon carbide substrate may be off-cut at an angle between 2° and 8° from the plane defined by the <10-10> and <11-20> crystallographic axes. The first and second conductivity type pillars may each extend at least 4 microns into the drift layer from an upper surface of the drift layer. The second conductivity type pillar may have a doping concentration that varies as a function of depth by less than a factor of ten throughout at least a 2.5 micron deep portion of the second conductivity type pillar. The method may further include implanting impurities into selected portions of the drift layer at an implant angle that is within +/−1.5° of the <11-20> crystallographic axis.

Pursuant to still additional embodiments of the present invention, a method of forming a semiconductor device is provided in which a silicon carbide drift layer is formed and then a mask is formed on an upper surface of the silicon carbide drift layer. Impurities having a first conductivity type are implanted into selected portions of the drift layer, wherein the impurities are implanted at an angle that is within +/−1.5° of one of the <11-23>, <−1-123>, <1-213>, <−12-13>, <2-1-13> or <−2113> crystallographic axes to form a first implanted region within the drift layer that has the first conductivity type, the first implanted region having a first sidewall that is slanted with respect to the upper surface of the silicon carbide drift layer. The first sidewall forms one side of a p-n junction in the drift layer that is part of a superjunction structure within the drift layer. Impurities having a second conductivity type that is opposite the first conductivity type may also be implanted into selected portions of the drift layer, where these impurities are implanted at an angle that is within +/−1.5° of one of the <11-23>, <−1-123>, <1-213>, <−12-13>, <2-1-13> or <−2113> crystallographic axes to form a second implanted region within the drift layer that has the second conductivity type, the second implanted region having a first sidewall that is slanted with respect to the top surface of the silicon carbide drift layer.

In some embodiments, the first implanted region may comprise a p-type pillar, and the second implanted region may comprise an n-type pillar that directly contacts the p-type pillar. The p-type pillar may have at least two sidewalls that are slanted at an angle of between 10° and 13°, between 15.5° and 18.5°, or between 30° and 33° from the <0001> crystallographic axis. The n-type and p-type pillars may each extend at least 4 microns into the drift layer from the upper surface of the drift layer. The p-type pillar may have a doping concentration that varies as a function of depth by less than a factor of ten throughout at least a 2.5 micron deep portion of the p-type pillar.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
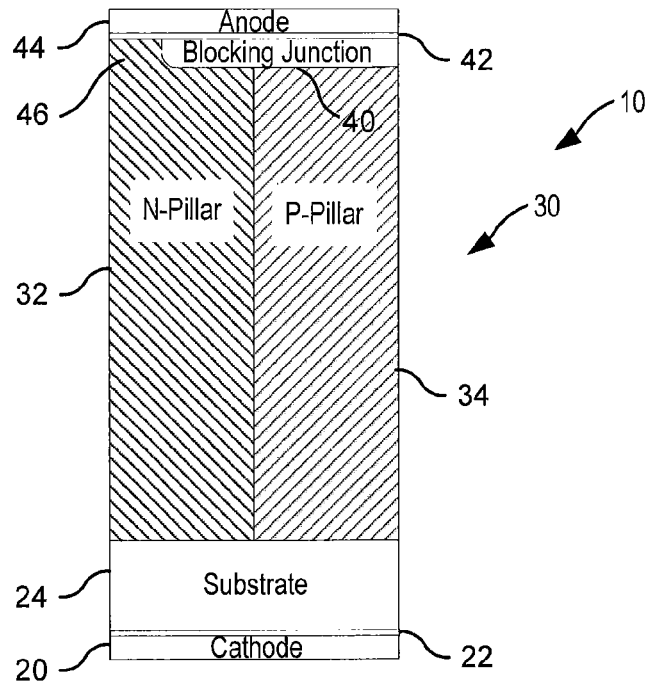
FIG. 1 is a schematic cross-sectional diagram of a conventional power semiconductor device that has a superjunction-type drift region.

Power semiconductor devices having superjunction-type drift regions have conventionally been formed in two different ways. Under the first approach, a semiconductor drift region having a first conductivity type (e.g., n-type) may be epitaxially grown on a substrate, and then an etching step may be performed to form one or more trenches in the epitaxial layer to create one or more pillars of semiconductor material having the first conductivity type. The sidewall(s) of the trench(s) may then be oxidized, and the trench(es) may then be refilled by epitaxially growing semiconductor material that is doped with impurities having a second conductivity type (e.g., p-type) to form one or more pillars of semiconductor material having the second conductivity type.

In the second approach for forming superjunction-type drift regions, the semiconductor drift region may be epitaxially grown on the substrate and then n-type and p-type dopants may be selectively implanted into the drift region to form the respective n-type and p-type pillars. The implanted dopants may be diffused throughout the pillars via, for example, thermal annealing. If necessary, multiple epitaxial growth and ion implantation steps may be performed to form a superjunction-type drift region having a desired thickness. Either approach may be used to form superjunction-type drift regions in, for example, silicon power devices. As will be apparent from the discussion that follows, the semiconductor pillars that are used to form superjunction-type drift regions are regions which extend vertically through at least a portion of the drift region and that can have a variety of different shapes.

The above-described conventional techniques for forming superjunction-type drift regions may not be very well-suited for forming superjunction-type drift regions in certain higher bandgap semiconductor materials, such as silicon carbide. For example, the first conventional fabrication method that is discussed above, namely, forming a trench in the drift region that is refilled with semiconductor material of the second conductivity type, may be problematic in silicon carbide because the breakdown voltage of the oxide layer that is formed between the n-type and p-type pillars is about the same as the breakdown voltage for silicon carbide. As a result, during reverse bias operation, carrier tunneling into the oxide layer may occur that can result in leakage currents through the oxide or even destructive avalanche breakdown. Additionally, in silicon carbide, non-uniform incorporation of the second conductivity type dopants may occur in the vicinity of the trench sidewalls during the epitaxial trench refill step, which may make it difficult to control the charge of the second conductivity type pillar.

The second of the above-described conventional techniques, may not work well in silicon carbide because n-type and p-type dopants do not tend to diffuse well in silicon carbide, even at high temperatures. This is also true in various other compound semiconductor materials such as gallium nitride based semiconductor materials, which dissociate before thermal diffusion can occur. As a result, the ion implantation process provides the primary means of obtaining a desired dopant profile in the drift region. When dopant ions are implanted into a semiconductor layer, the ions damage the crystal lattice of the semiconductor layer, which typically can only partly be repaired by thermal annealing. The depth at which the ions are implanted is directly related to the energy of the implant, i.e., ions implanted into a semiconductor layer at higher energies tend to go deeper into the layer. Thus, forming deep implanted regions requires high energy implants. However, lattice damage is also directly related to implant energy: higher energy implants also tend to cause more lattice damage than lower energy implants, and the uniformity of the ion implant decreases with increasing implant depth. Thus, to form implanted regions that have good doping uniformity by depth and/or acceptable levels of lattice damage, it is necessary to perform a large number of successive epitaxial growth/ion implantation steps to obtain drift layers having sufficient thicknesses to achieve breakdown voltages on the order of several kilovolts. Such large numbers of epitaxial growth and ion implantation steps increase the time and cost of device fabrication.

A third approach for forming superjunction structures in 4H silicon carbide has recently been proposed that is disclosed in U.S. Patent Publication No. 2015/0028350, the entire content of which is incorporated herein by reference. Under this approach, the n-type and p-type pillars are formed via ion implantation, where the ion implantation is carefully controlled to be at an implant angle of less than 2° from the <0001> crystallographic axis so that the ions may channel into the crystal. This approach has been shown to yield junction depths of up to 4 microns with 900 keV implant energies, and may provide an economically feasible method for manufacturing power semiconductor devices having blocking voltages in the 600-1200 volt range. However, this approach is generally believed to not be scalable to fabricate devices having higher blocking voltages.

Embodiments of the present invention are based on a realization that the depth and quality of an ion implantation step in 4H silicon carbide and other high bandgap and/or compound semiconductor materials will be a function of the lattice structure as seen along the longitudinal axis of the ion beam. In particular, there are certain geometrical relationships between the ion beam and the lattice structure of the silicon carbide (or other material) that can provide large channels that are particularly effective for achieving deep dopant ion implantation depths and more uniform dopant concentration as a function of depth. By implanting ions directly along these channels, implanted regions can be formed in silicon carbide that exhibit good uniformity as a function of depth using lower energy implants, which result in reduced lattice damage.

According to some embodiments, the ion implantation may be performed along the <11-23> crystallographic axis of a 4H silicon carbide layer structure or along a symmetrically equivalent crystallographic axis. The symmetrically equivalent crystallographic axes to the <11-23> crystallographic axis are the <-1-123>, <1-213>, <-12-13>, <2-1-13> and <-2113> crystallographic axes. Each of these six symmetrically equivalent crystallographic axes are at a 17° tilt from the <0001> crystallographic axis. As discussed in detail herein, along these six crystallographic axes, relatively large channels appear in the crystallographic structure that facilitate deep implantation of dopants via ion implantation. As another example, the ion implantation may be performed along the <11-20> crystallographic axis, which exhibits very large channels along with a low surface density of atoms as viewed along the axis of implantation. It has been demonstrated that far deeper ion implantations can be achieved (for a given ion implantation energy) by performing the ion implantation along such channels in the lattice structure, which can be used to provide lower cost and/or higher performing power semiconductor devices.

When ions are implanted into a semiconductor material, the implanted ions tend to scatter when they impact atoms in the crystal lattice of a semiconductor material. When the direction of implantation is oriented at an oblique angle to each of the major axes of the crystal lattice, the atoms in the crystal lattice may appear to have a random distribution relative to the direction of implantation. As a result, the likelihood of collisions between implanted ions and atoms in the crystal lattice may be fairly uniform with increasing depth. If, however, the direction of implantation is along (or very close to) a major axis of the crystal lattice, the atoms in the crystal lattice may "line up" relative to the direction of implantation. When the atoms line up in this fashion as viewed along the longitudinal axis of the ion beam, channels appear in the crystal lattice where no atoms are located. When ions are implanted along these channels, the implanted ions may tend to travel down the channels in the crystal structure. This reduces the likelihood of collisions between the implanted ions and the atoms in the crystal lattice, especially near the surface of the semiconductor layer. As a result, the implant depth of the ion implant (and hence the depth of a superjunction structure formed by such ion implantation) may be greatly increased, and devices having increased breakdown voltages and good on-state resistance levels may be achieved. As used herein, the term "implant depth" refers to the depth from a surface of the crystal that the ions are implanted into at which the concentration of implanted dopants falls below $10^{14}$ cm$^{-3}$.

In many, if not most, ion implantation applications, it is not desirable for the depth of the implant to be increased by channeling, as the depth of the implant may be greater than the desired depth of the implanted region. Consequently, in silicon carbide processing it is conventional when implanting ions along or near a crystallographic axis of the semiconductor layer to form a sacrificial screen layer, such as an amorphous silicon dioxide layer, on the layer to be implanted, and to implant the ions into the semiconductor layer through the amorphous screen layer. The screen layer has the effect of randomizing the direction of the implanted ions, thereby reducing the channeling effect in the underlying lattice structure.

In general, channeling occurs in silicon carbide when the direction of implantation is within about 2° of a crystallographic axis of the silicon carbide crystal and, more particularly when the direction of implantation is within +/−1° of a crystallographic axis. When the direction of implantation is offset by more than +/−1° from each crystallographic axis, the channeling effect is significantly reduced, and when the direction of implantation is offset by more than about 2° from each crystallographic axis of the silicon carbide crystal, the atoms in the crystal lattice may appear to be randomly distributed relative to the direction of implantation.

Pursuant to some embodiments of the present invention, power semiconductor devices are provided that have superjunction-type drift regions which are formed by implanting ions along the <11-23> crystallographic axis or along a symmetrically equivalent crystallographic axis (i.e., along one of the <11-23>, <-1-123>, <1-213>, <-12-13>, <2-1-13> and <-2113> crystallographic axes). Each of these six crystallographic axes is at an angle of 17° with respect to the <0001> crystallographic axis. The superjunction-type drift region may include alternating pillars that are relatively heavily doped with p-type and n-type impurities, respectively. As the pillars may have relatively heavy doping densities, the on-state resistance of the semiconductor device may be significantly reduced. Moreover, since the drift region may be thicker, the breakdown voltage of the device may be increased. Thus, the semiconductor devices according to embodiments of the present invention may exhibit higher breakdown voltages than conventional devices while also having lower drift region resistance when the devices are in their on-state.

Pursuant to further embodiments, semiconductor devices are provided that include a 4H silicon carbide drift region that has an upper portion and a lower portion. A first contact is formed on the upper portion of the drift region and a second contact is formed on the lower portion of the drift region. The drift region includes a superjunction structure that includes a p-n junction that is formed at an angle of between 6° and 35° from a plane that is normal to a top surface of the drift region. In other embodiments, this angle may be between 10° and 30° from a plane that is normal to a top surface of the drift region. In still other embodiments, this angle may be between 14° and 20° from a plane that is normal to a top surface of the drift region. In yet further embodiments, this angle may be between 6° and 15° from a plane that is normal to a top surface of the drift region. This p-n junction extends within +/−1.5° of a crystallographic axis of the 4H silicon carbide material forming the drift region.

Pursuant to further embodiments, semiconductor devices are provided that include a 4H silicon carbide drift region that has an upper portion and a lower portion. A first contact is formed on the upper portion of the drift region and a second contact is formed on the lower portion of the drift region. The drift region includes a first pillar that is doped with first conductivity type impurities, the first pillar having a first sidewall that is slanted at an angle of between 15.5° and 18.5° from the <0001> crystallographic axis. A second pillar is provided in the drift region that is doped with second conductivity type impurities that are opposite the first conductivity type impurities. The first and second pillars may be adjacent to each other.

Pursuant to still further embodiments, semiconductor devices are provided that include a 4H silicon carbide drift region that has an upper portion and a lower portion. A first contact is formed on the upper portion of the drift region and a second contact is formed on the lower portion of the drift region. The drift region includes a superjunction structure that includes a first pillar that is doped with first conductivity type impurities, the first pillar having a first sidewall that is slanted at an angle of between −1.5° and 1.5° from the <11-20> crystallographic axis. The drift region further includes a second pillar that is doped with second conductivity type impurities that are opposite the first conductivity type impurities adjacent the first pillar, the second pillar having a first sidewall that is slanted at an angle of between −1.5° and 1.5° from the <11-20> crystallographic axis.

Methods of forming the above-described semiconductor devices are also provided. Pursuant to these methods, dopant impurities are implanted into selected portions of an upper surface of a drift region of a semiconductor device at an angle that is within +/−1.5° of either the <11-23> (or a symmetrically equivalent crystallographic axis) or <11-20> crystallographic axes to form one or more pillars of a superjunction structure within the drift region.

Example embodiments of the present invention will now be described with reference to the attached drawings. It will be appreciated that features of the different embodiments disclosed herein may be combined in any way to provide many additional embodiments.

Figure 2:
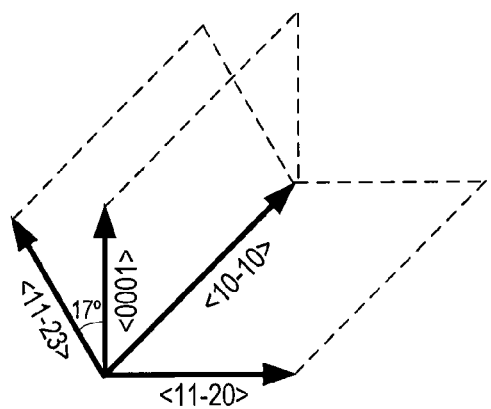
FIG. 2 is a schematic diagram illustrating the relative locations of various crystallographic axes in 4H silicon carbide.

FIG. 2 is a schematic diagram illustrating the relative locations of various crystallographic axes in 4H silicon carbide. As shown in FIG. 2, the <10-10> crystallographic axis is perpendicular to each of the <0001>, <11-20> and <11-23> crystallographic axes. The <11-20> crystallographic axis is perpendicular to the <0001> crystallographic axis, and the <11-23> crystallographic axis is offset by about 17° from the <0001> crystallographic axis in the direction away from the <11-20> crystallographic axis.

Figure 3A:
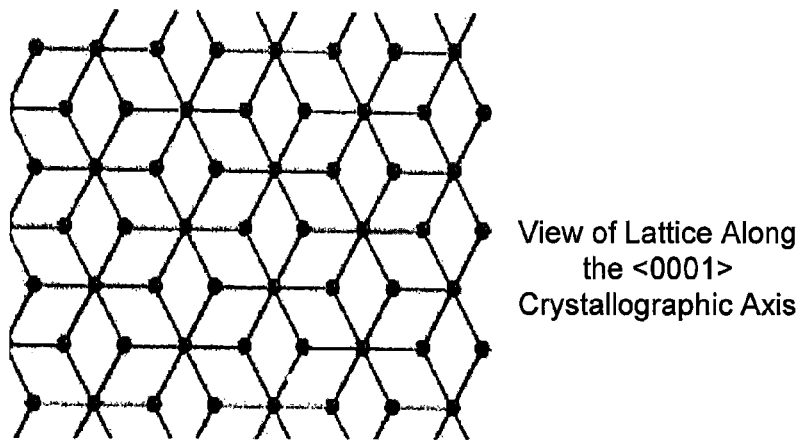
FIGS. 3A-3C illustrate the lattice structure of 4H silicon carbide as viewed along the <0001>, <11-23> and <11-20> crystallographic axes, respectively.
Figure 3B:
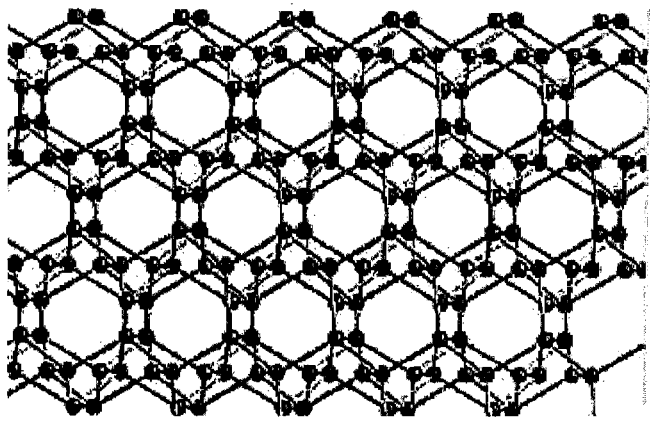
Figure 3C:
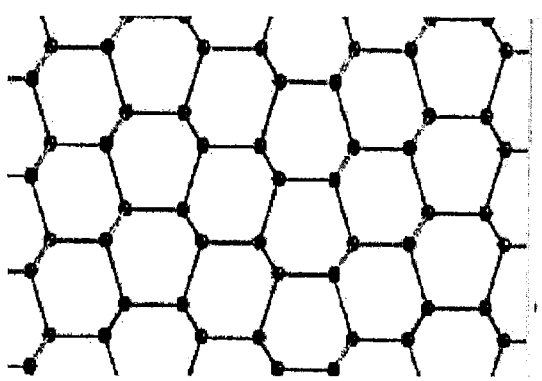

FIGS. 3A-3C illustrate the lattice structure of 4H silicon carbide as seen along the <0001>, <11-23> and <11-20> crystallographic axes, respectively. As shown in FIG. 3A, the density of atoms at the surface (the atoms are shown by the small circles in FIG. 3A) is relatively low, which is a favorable condition for deeper ion implant depths. A plurality of channels are provided between the atoms which allow for channeling of the implanted ions to relatively deeper depths into the semiconductor material. However, the channels themselves are relatively small in cross-sectional area. Relatively speaking, the smaller a channel is in cross-sectional area, the shallower the implant depth. Thus, while ion implantation along the <0001> crystallographic axis will exhibit channeling, the implant depths achievable are still limited.

FIG. 3B illustrates the lattice structure of 4H silicon carbide as viewed along the <11-23> crystallographic axis. The lattice structure will look the same as shown in FIG. 3B when viewed along any of the <−1-123>, <1-213>, <−12-13>, <2-1-13> and <−2113> crystallographic axes. Given the hexagonal lattice of 4H silicon carbide, the six crystallographic axes listed above are all offset by 17 degrees from the <0001> crystallographic axis and are spaced apart from each other by 60 degree increments. The vectors that are offset by 17 degrees from the <0001> crystallographic axis form a cone that rotates through 360 degrees. The <11-23>, <−1-123>, <1-213>, <−12-13>, <2-1-13> and <−2113> crystallographic axes all extend along this cone, and are separated from each other by 60 degrees. At most rotation angles about this cone, the lattice structure will appear "crowded" with closely-spaced atoms throughout. However, as shown with reference to FIG. 3B, at six different locations that correspond to the <11-23>, <−1-123>, <1-213>, <−12-13>, <2-1-13> and <−2113> crystallographic axes, the atoms "line up" so that distinct channels appear in the lattice structure. As can be seen in FIG. 3B, along these six crystallographic axes, the density of atoms at the surface is increased as compared to the example of FIG. 3A, which will typically result in increased scattering of ions. Advantageously, however, the channels that are provided between the atoms have a larger cross-sectional area as compared to the channels in the example of FIG. 3A. As will be shown herein, this may allow for increased implant depths.

As can be seen in FIG. 3C, when 4H silicon carbide is viewed along the <11-20> crystallographic axis, the density of atoms at the surface may be very low, and channels having large cross-sectional areas are provided within the lattice structure. Such a structure may allow for very deep implant depths. Unfortunately, however, the <11-20> crystallographic axis is typically nearly perpendicular to the major faces of a silicon carbide wafer when the wafer is cut in a traditional manner, and hence it may be difficult to provide silicon carbide wafers that have a major face cut along, or at a relatively small tilt from, the <11-20> crystallographic axis. Thus, ion implantation along the <11-20> crystallographic axis may not be an option in many applications.

Figure 4:
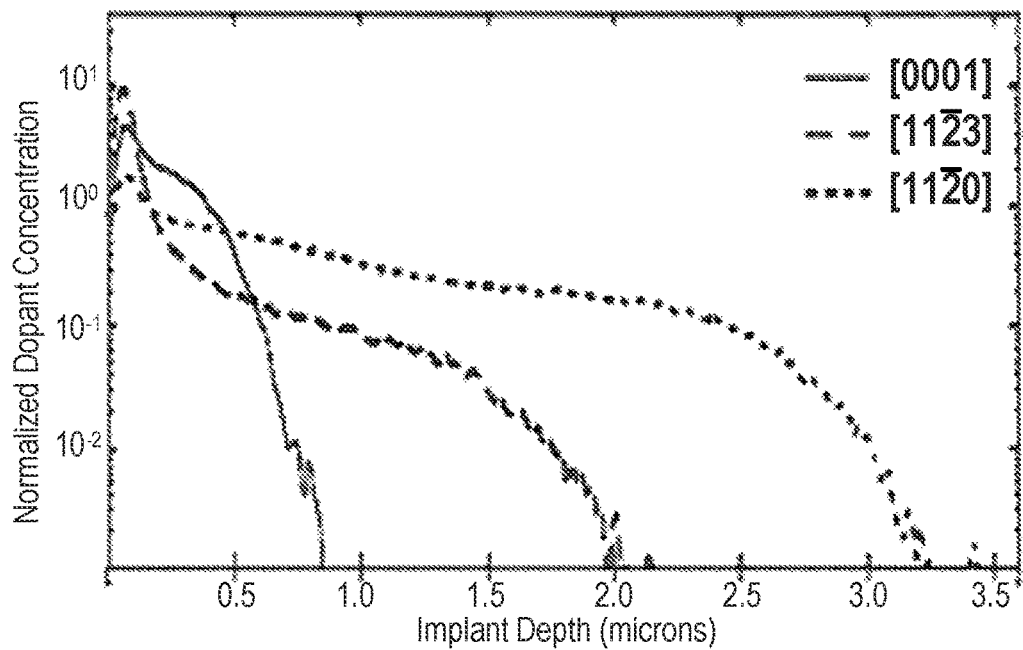
FIG. 4 is a graph of secondary ion mass spectroscopy (SIMS) data illustrating implanted dopant concentrations for $^{27}$Al ions implanted into 4H silicon carbide along the <0001>, <11-23> and <11-20> crystallographic axes at an implantation energy of 60 keV.

FIG. 4 is a graph of data obtained by secondary ion mass spectroscopy (SIMS) that illustrates implanted dopant concentrations in 4H silicon carbide for $^{27}$Al ions implanted at an implant energy of 60 keV where the ions are implanted along the <0001>, <11-23> and <11-20> crystallographic axes. Identical results to that shown for the <11-23> crystallographic axis in FIG. 4 are expected for implantation along any of the <−1-123>, <1-213>, <−12-13>, <2-1-13> and <−2113> crystallographic axes. As shown in FIG. 4, when dopant ions implanted along the <0001> crystallographic axis, the dopant concentration falls off relatively quickly as a function of depth within the implanted layer, and the dopant concentration is reduced by three orders of magnitude from the surface dopant concentration at a depth of about 0.8 microns. In contrast, when dopant ions implanted along the <11-23> crystallographic axis, the dopant concentration falls off more slowly and exhibits a more uniform dopant concentration. Moreover, the dopant concentration remains within three orders of magnitude from the surface dopant concentration to a depth of about 2.0 microns, which is 250% deeper than the case of ions implanted along the <0001> crystallographic axis. When dopant ions implanted along the <11-20> crystallographic axis, the dopant concentration falls off at a very slow rate as a function of depth within the implanted layer, and remains remarkably uniform. In this case, the dopant concentration remains within three orders of magnitude from the surface dopant concentration to a depth of about 3.2 microns, which is 400% deeper than the case of ions implanted along the <0001> crystallographic axis. This data shows that deeper implants may be achieved by implanting the ions along the <11-23> and/or <11-20> crystallographic axes (or symmetrically equivalent crystallographic axes). As noted above, implantation along the <11-20> crystallographic axis may not currently be commercially practical for some applications. While not shown in FIG. 4, if channeling is not used the implant concentration will be below $10^{-2}$ at a depth of about 0.2 microns. Note that in FIG. 4 the ion implantation was performed at a low implant energy of 60 keV and it is surmised that with higher implant energies (e.g., in the 500-900 keV range) that very deep implants (and hence deep superjunction structures) may be achieved in 4H silicon carbide devices.

Conventionally, 4H silicon carbide wafers are cut from boules of bulk 4H silicon carbide material at a small offset angle from the plane defined by the <10-10> and <11-20> crystallographic axes. This offset angle is often referred to as an "off-cut" angle. While the boules are sometimes cut directly along the plane defined by the <10-10> and <11-20> crystallographic axes, higher quality silicon carbide epitaxial layers can typically be grown when the silicon carbide wafers are cut at a small off-cut angle from this plane. Off-cut angles of about 2° to about 8° are common. Thus, for example, if a 4H silicon carbide wafer is cut at a 4° angle from the plane defined by the <10-10> and <11-20> crystallographic axes (tilted toward the <11-23> crystallographic axis) then to implant along the <11-23> crystallographic axis, the ions should be implanted at an angle of 13° from the upper surface of the wafer. Similar adjustments to the implant angle (from 17°) are necessary if the ions are to be implanted along one of the other five crystallographic axes that are symmetrically equivalent to the <11-23> crystallographic axis).

Figure 5A:
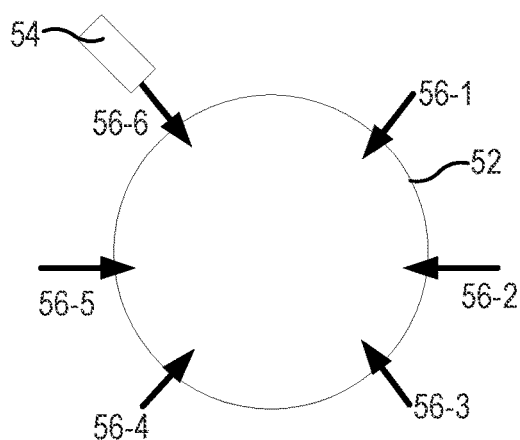
FIGS. 5A and 5B are a schematic plan view and schematic side view, respectively, of a 4H silicon carbide based semiconductor device illustrating implant angles that can provide enhanced channeling during ion implantation.
Figure 5B:
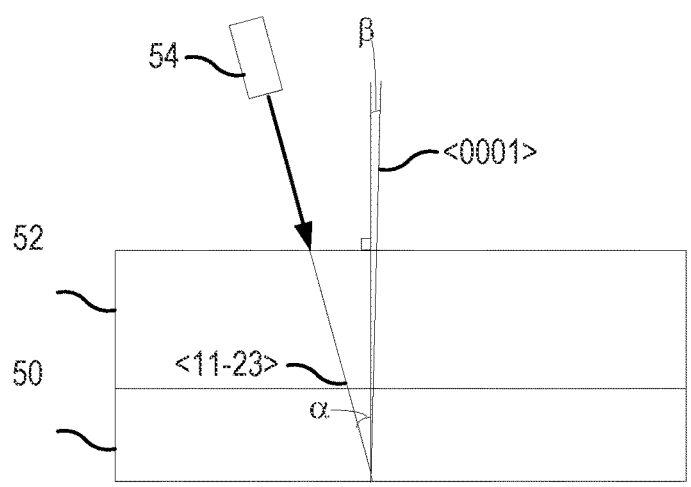

Pursuant to embodiments of the present invention, power semiconductor devices are provided that have superjunction type drift regions that are formed at least in part by ion implantation. In some embodiments, the dopant ions used to form the n-type pillars and/or the p-type pillars of the superjunction may be implanted at a 17° angle from the <0001> crystallographic axis, along the <11-23> crystallographic axis or a symmetrically equivalent crystallographic axis. This is shown graphically with reference to FIGS. 5A and 5B, which are a plan view and a side view of a 4H silicon carbide wafer 50 having an epitaxially grown 4H silicon carbide layer 52 thereon. As shown in FIGS. 5A-5B, ions are implanted into at least a portion of the epitaxial layer 52 using an ion implantation device. In the example of FIGS. 5A-5B, the wafer 50 is cut at a 4° angle from the plane defined by the <10-10> and <11-20> crystallographic axes (tilted toward the <11-23> crystallographic axis), as is shown graphically in FIG. 5B. The top surface of the wafer 50 is tilted relative to an ion implantation device 54 at an angle of 13° so that the ions will be implanted along the <11-23> crystallographic axis (i.e., at an implant angle of 17° from the <0001> crystallographic axis). As shown in FIG. 5A, the wafer 50 is rotated with respect to the ion implantation device 54 to one of six locations 56-1 through 56-6 where channels will appear in the crystal lattice as viewed along the axis of implantation (as discussed above, these channels appear along the <11-23>, <−1-123>, <1-213>, <−12-13>, <2-1-13> and <−2113> crystallographic axes). The angle of implantation can be tightly controlled (to a resolution, for example, of 0.1°) using Rutherford backscattering to align the wafer 50 with the implant beam. While not shown in FIGS. 5A-5B, an implant mask may be provided on the epitaxial layer 52 to define regions of the epitaxial layer 52 that are to be implanted. The ions may be implanted through openings in the mask directly into the epitaxial layer 52 without first passing through a screen layer.

One consequence of implanting the wafer at an angle with respect to the upper surface of the wafer is that the n-type and p-type pillars of the superjunction structure will be formed at an angle with respect to the top surface of the epitaxial layer 52. This feature of the devices according to certain embodiments of the present invention will be discussed in greater detail with respect to FIGS. 6A-6C and FIGS. 7A-7C.

Figure 6A:
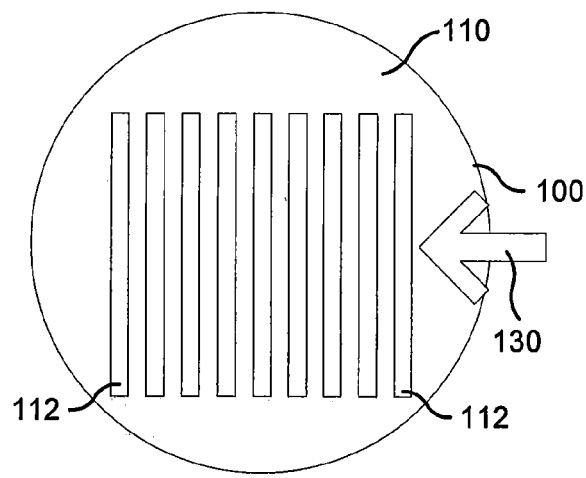
FIGS. 6A and 6B are plan views of a semiconductor wafer having an epitaxial layer and respective first and second ion implantation masks formed thereon.
Figure 6B:
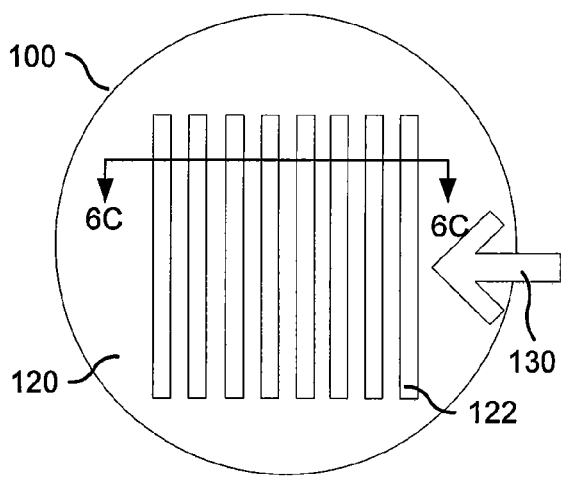
Figure 6C:
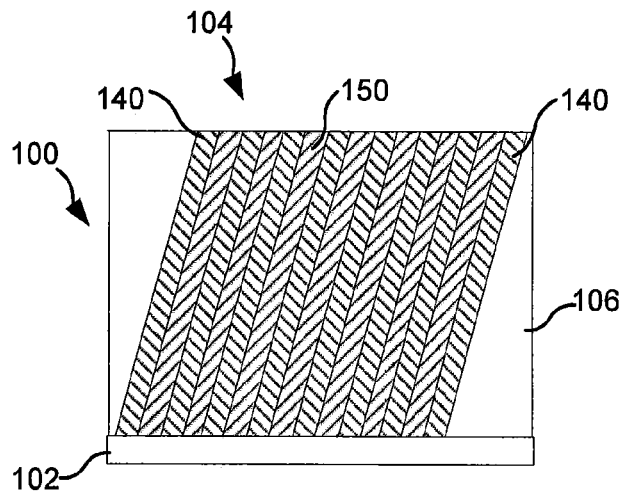
FIG. 6C is a cross-sectional view taken along line 6C-6C of FIG. 6B after the second ion implantation mask has been removed.

Referring first to FIGS. 6A-6C, FIGS. 6A and 6B are plan views of a 4H silicon carbide structure 100 that includes a 4H silicon carbide substrate 102 with a 4H silicon carbide epitaxial layer 104 grown thereon. The substrate 102 is cut at a 4° angle from the plane defined by the <10-10> and <11-20> crystallographic axes, where the wafer is tilted 4° toward the <11-23> crystallographic axis. FIG. 6C is a cross-sectional view taken along line 6C-6C of FIG. 6B. As shown in FIG. 6A, a first mask 110 having elongated openings 112 formed therein is formed on an upper surface of the epitaxial layer 104. N-type dopants are selectively implanted into the epitaxial layer 104 through the openings 112 in the first mask 110. As shown in FIG. 6B, in a subsequent processing step, the first mask 110 is removed and a second mask 120 having elongated openings 122 is formed on the upper surface of the epitaxial layer 104. P-type dopants are selectively implanted into the epitaxial layer 104 through the openings 122 in the second mask 120. The second mask 120 may cover regions of the epitaxial layer 104 that were exposed by the first mask 110 so that the ion implantation steps may form alternating n-type and p-type pillars within the epitaxial layer 104. Each mask 110, 120 may cover the entire surface of the epitaxial layer 104 except for the regions underneath the openings 112, 122. An arrow 130 is provided in each of FIGS. 6A-6C that illustrate the direction of implantation. As can be seen, in the example of FIGS. 6A-6C the direction of implantation is generally perpendicular to the elongated openings 112, 122 in the masks 110, 120. The ions are implanted at an angle of 13° with respect to the upper surface of the epitaxial layer 104.

In the cross-sectional view of FIG. 6C, the second mask 120 is not shown for simplicity. As can be seen in FIG. 6C, when the n-type dopants are implanted into the epitaxial layer 104, n-type pillars 140 are formed within the epitaxial layer 104. These n-type pillars 140 extend at angles through the epitaxial layer 104, as the dopant ions are implanted at an angle of 13° with respect to the top surface of the epitaxial layer 104 and hence the n-type dopants penetrate underneath the masked areas. Likewise, when the p-type dopants are implanted into the epitaxial layer 104 they form p-type pillars 150 within the epitaxial layer 104. The p-type pillars 150 also extend at angles through the epitaxial layer 104. The angled nature of the n-type and p-type pillars 140, 150 can readily be seen in the cross-section of FIG. 6C. Areas 106 of the epitaxial layer 104 that are not implanted may, for example, be lightly doped n-type or may be undoped.

Figure 7A:
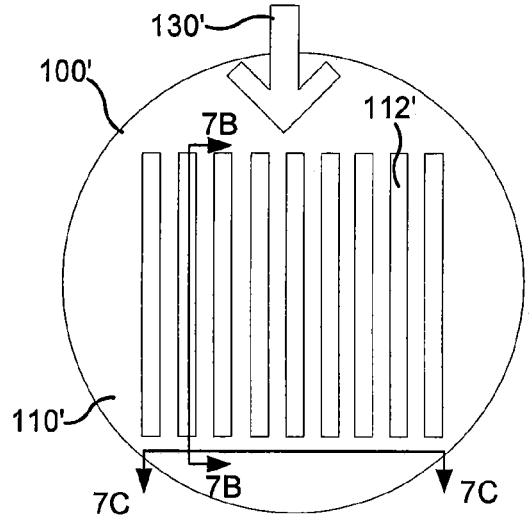
FIG. 7A is a plan view of a semiconductor wafer having an epitaxial layer and a mask thereon.
Figure 7B:
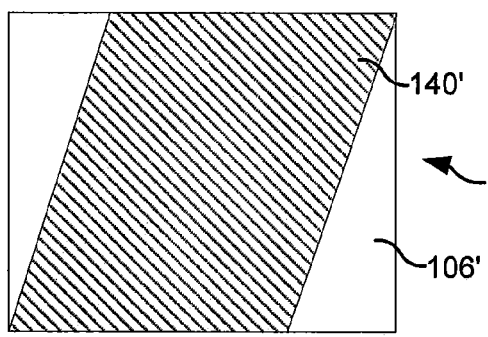
FIGS. 7B and 7C are cross-sectional views taken along lines 7B-7B and 7C-7C, respectively, of FIG. 7A.
Figure 7C:
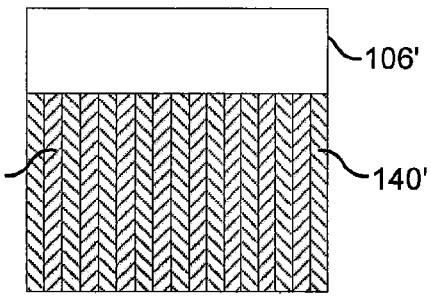

It will be appreciated that the direction of the elongated openings 112, 122 in the masks 110, 120 can be rotated with respect to the location of the ion implantation equipment, since the elongated openings 112, 122 in the masks 110, 120 can be formed at any selected orientation. FIGS. 7A-7C illustrate the pillar structure within another structure 100' that includes a 4H silicon carbide substrate 102' with a 4H silicon carbide epitaxial layer 104' grown thereon. In the case of FIGS. 7A-7C, the angle of implantation is rotated 90° with respect to the angle of implantation shown in the case of FIGS. 6A-6C. In particular, FIG. 7A is a plan view of the 4H silicon carbide structure 100' having a mask 110' thereon that includes elongated openings 112'. The substrate 102' included in structure 100' is cut at a 4° angle from the plane defined by the <10-10> and <11-20> crystallographic axes, where the wafer is tilted 4° toward the <11-23> crystallographic axis. The arrow 130' in FIG. 7A illustrates the direction of implantation. As can be seen, the direction of implantation 130' is parallel to the longitudinal axes of the elongated openings 112' in the mask 110'.

FIGS. 7B and 7C are cross-sectional views taken along lines 7B-7B and 7C-7C, respectively, of FIG. 7A. As shown in FIG. 7B, each n-type pillar 140' in epitaxial layer 104' has slanted end portions. While not shown in the figures, each p-type pillar 150' will have the same shape. The slant in the end portions of each pillar 140', 150' can also be seen in FIG. 7C, which is a cross-sectional view taken just beyond the end of each elongated opening 112'. As shown in FIG. 7C, the bottom portions of the pillars 140', 150' extend into the cross-sectional view because of the 13° implantation angle with respect to the top surface of the epitaxial layer 104', while the top portion of the epitaxial layer 106' along the cross-sectional view is undoped.

Thus, as shown by the above discussion, the n-type and p-type pillars may be slanted. As shown in FIGS. 6A-6C, in some cases the sidewalls of the pillars may be slanted relative to the top surface of the epitaxial layer 104. As shown in FIGS. 7A-7C, in other cases the end walls of the pillars may be slanted. While not shown in the figures, it will be appreciated that in other cases where the direction of implantation is between the directions 130 and 130' shown in the above examples both the sidewalls and the end walls of the pillars may be slanted. In each case, such pillars will be referred to herein as "slanted pillars."

The use of channeling to increase the ion implantation depth may not only allow for deeper implantation, but may also reduce the lateral distribution of implants, which provides better process control and smaller feature sizes. In addition, significantly thinner implant masks may be used when channeled ion implantation is performed, because the implant energies may be lower than would otherwise be required to achieve similar implant ranges. In some cases, the implant mask may be less than half the thickness that would otherwise be required to obtain similar implant ranges.

For example, to achieve a junction depth of 3.5 microns in 4H silicon carbide without channeling, it may be necessary to perform the implant at an implant energy of 5 MeV. For such an implant energy, a $SiO_2$ mask having a thickness of 5.0 microns would typically be used to ensure ions are only implanted into the unmasked areas. If the implant energy is reduced to 750 keV, a $SiO_2$ mask may be used that has a thickness of about 2.0 microns. Using the channeling techniques according to embodiments of the present invention, it is believed that significantly smaller implant energies may be used (i.e., implant energies of less than 100 kEV may be sufficient to obtain implant depths of 3 microns or more). Accordingly, in some embodiments, the ion implantation masks may be significantly thinner as compared to the masks used with non-channeled implants to obtain similar implant depths, and the use of such thinner masks may decrease device fabrication time and reduce manufacturing costs.

Another potential consequence of the slanted pillars shown in FIGS. 6C, 7B and 7C above is that the slanted geometry may result in a perturbation in the symmetry of the device (as compared to a conventional superjunction structure), which has the potential to reduce the breakdown fields in, for example, corner regions of a device. However, simulations have shown that good electrical field symmetry can be achieved with, for example, a 13° implant angle from the <0001> crystallographic axis.

Figure 8:
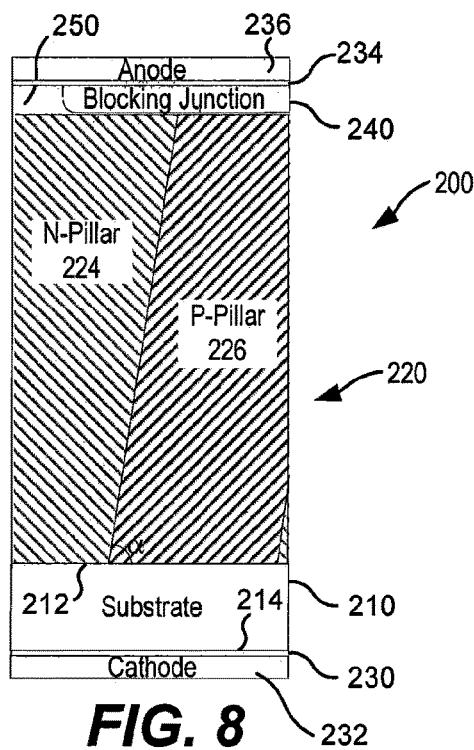
FIG. 8 is a schematic cross-sectional diagram of a JBS diode that has a superjunction-type drift region formed using the channeling ion implantation techniques according to embodiments of the present invention.

FIG. 8 is a schematic cross-sectional diagram of a power semiconductor device in the form of a JBS diode 200 that has a superjunction-type drift region formed using the channeling ion implantation techniques according to embodiments of the present invention.

As shown in FIG. 8, the JBS diode 200 includes a substrate 210, a drift region 220 that includes a superjunction structure, contact layers, a blocking junction 240 and a channel region 250.

The substrate 210 may comprise a 4H silicon carbide semiconductor wafer that has an upper surface 212 and a lower surface 214. The substrate 210 may be doped with n-type impurities (i.e., an n+ silicon carbide substrate). The impurities may comprise, for example, nitrogen or phosphorous. The doping concentration of the substrate 210 may be, for example, between $1 \times 10^{18}$ atoms/cm$^3$ and $1 \times 10^{21}$ atoms/cm$^3$. The substrate 210 may be any appropriate thickness (e.g., between 100 and 500 microns thick).

The drift region 220 may comprise, for example, a silicon carbide drift region 220 that is epitaxially grown on the upper surface 212 of the substrate 210. In example embodiments, the drift region 220 may be between 3 and 100 microns thick. The drift region 220 includes a superjunction structure that comprises at least a first n-type silicon carbide pillar 224 and a first p-type silicon carbide pillar 226. While not shown in FIG. 8, it will be appreciated that two or more n-type pillars 224 and/or two or more p-type pillars 226 may be provided. The number of pillars 224, 226 provided will be a function of the width selected for the pillars. Typically, each n-type pillar 224 and p-type pillar 226 will have the same width, although embodiments of the present invention are not limited thereto. The superjunction-type drift region 220 may be designed to be charge balanced between the alternating n-type and p-type pillars 224, 226 in some embodiments As shown in FIG. 8, the n-type pillar 224 and the p-type pillar 226 each comprise slanted pillars. Each pillar 224, 226 may be slanted at an angle α with respect to the upper surface of the substrate 210. If the JBS diode 200 is formed using the implant direction illustrated in FIGS. 6A-6C on a 4° off-cut 4H silicon carbide wafer, then the angle α may be 13°. As described above, an implant angle of about 13° so that the ions are implanted along the <11-23> crystallographic axis may achieve high levels of channeling when implanting a 4H silicon carbide wafer that is cut at an angle of 4° from the plane defined by the <10-10> and <11-20> crystallographic axes.

While FIG. 8 shows the entirety of the drift region being implanted, it will be appreciated that this need not be the case. For example, in other embodiments, only an upper portion of the drift region 220 may be implanted. An example of a power semiconductor device according to embodiments of the present invention that has a drift region that is not implanted throughout its entire depth is discussed below with reference to FIG. 13. It will also be appreciated that the doping concentration of the implanted portion of the drift region tends to decrease with increased distance from the upper surface of the device.

Referring again to FIG. 8, the contact layers include an ohmic contact layer 230 that is on the bottom surface 214 of the substrate 210, a cathode contact 232 that is on the ohmic contact layer 230, a Schottky contact layer 234 that is on a top surface of the drift region 220, and an anode contact 236 that is on the Schottky contact layer 234. The ohmic contact layer 230 may comprise a material that forms an ohmic contact to the substrate 210. For example, if the substrate 210 comprises a heavily doped n-type silicon carbide substrate 210, the ohmic contact layer 230 may comprise a silicon/cobalt layer. The cathode contact 232 may comprise a highly conductive metal contact such as a silver layer. In some embodiments, the cathode contact 232 may comprise a multilayer metal structure such as, for example, a Ti/Ni/Ag structure. In some embodiments, the substrate 210 may be partially or completely removed prior to formation of the ohmic contact layer 230 and the cathode contact 232.

The Schottky contact layer 234 may comprise a conductive layer that forms a Schottky contact with the silicon carbide drift region 220. In some embodiments, the Schottky contact layer 234 may comprise a nickel layer. The anode contact 236 may comprise a highly conductive metal contact such as an aluminum layer.

The blocking junction 240 may comprise a highly doped p-type region in an upper portion of the drift region 220. As shown in FIG. 8, in some embodiments, the blocking junction 240 may substantially or completely cover a top surface of the p-type silicon carbide pillar 226. The blocking junction 240 may also partially cover a top surface of the n-type silicon carbide pillar 224. The blocking junction 240 may reduce the electric field to help shield the Schottky contact 234 from the electric field when the JBS diode 200 operates in the blocking state. A channel 250 may be provided between the n-type silicon carbide pillar 224 and the Schottky contact 234. Current flows through the channel 250 when the JBS diode 200 is in its on-state. The blocking junction 240 may incorporate, for example, a MOSFET, JFET, BJT, or thyristor type structure to allow controllable flow of current through the device.

The pillars 224, 226 may extend much deeper than the pillars that are included in superjunction structures of conventional 4H silicon carbide semiconductor devices. The reason for this is that the n-type and p-type dopants are implanted into the silicon carbide at angles that allow for channeling to occur so that the dopant ions may be implanted deeper into the device, as is discussed above with respect to FIGS. 3A-3C in a single ion implantation step. As discussed above, these deeper implants allow faster fabrication of power semiconductor devices that have thick superjunction type drift layers. The thicker drift layers increase the voltage blocking capabilities of the device, while the superjunction structure helps reduce or eliminate any offsetting increase in the on-state resistance of the device that would otherwise occur as a result of the increased thickness of the drift layer.

Figure 9A:
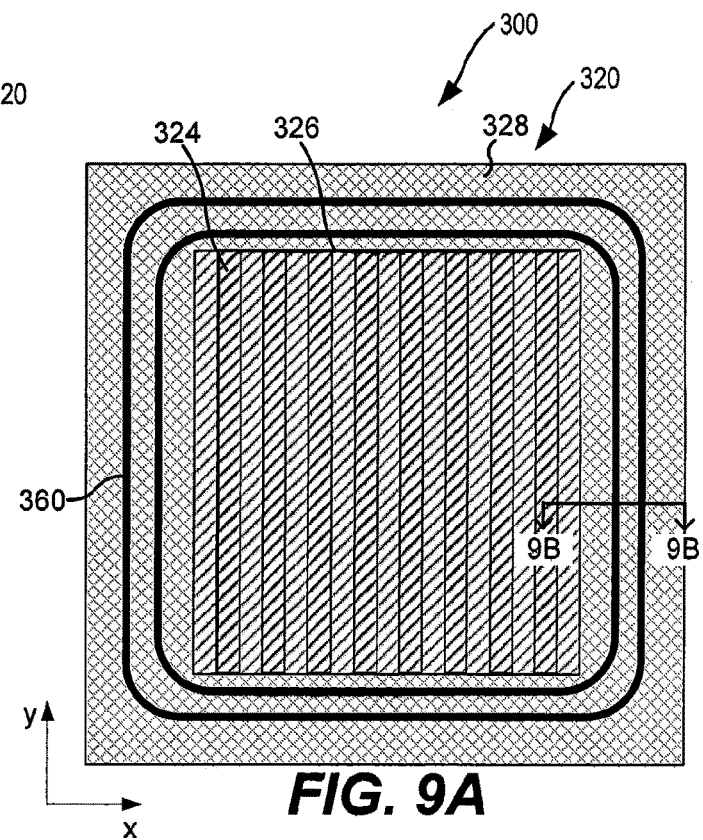
FIG. 9A is a schematic plan view of a power semiconductor device that has a superjunction-type drift region according to further embodiments of the present invention.

FIG. 9A is a schematic plan view of a power semiconductor device 300 that has a superjunction-type drift region according to embodiments of the present invention. In FIG. 9A, the topside metallization and active structures of the device 300 have been omitted to illustrate the semiconductor pillar structures.

As shown in FIG. 9A, the semiconductor device 300 includes a semiconductor drift region 320 that has a plurality of interleaved n-type silicon carbide pillars 324 and p-type silicon carbide pillars 326. In the embodiment of FIG. 9A, each n-type silicon carbide pillar 324 comprises a bar or "fin" shaped pillar that extends along a first direction (the y-axis direction) on the top surface of a substrate 302 (see FIG. 9B). Each p-type silicon carbide pillar 326 likewise comprises a bar shaped pillar that extends along the first direction (the y-axis direction) on the top surface of the substrate 302. As shown, the n-type and p-type pillars 324, 326 are disposed in alternating fashion. Portions of the drift region 320 other than the pillars 324, 326 may comprise, for example, lightly doped n-type silicon carbide which surrounds the n-type and p-type pillars 324, 326.

As is also shown in FIG. 9A, a plurality of guard rings 360 surround the n-type and p-type silicon carbide pillars 324, 326. The guard rings 360 may comprise edge termination structures. As known to those of skill in the art, when power semiconductor devices are operated in the blocking state, leakage currents may begin to flow at the edges of the active region as the voltage is increased. Leakage currents tend to flow in these edge regions because electric field crowding effects at the edge of the device may result in increased electric fields in these regions. As noted above, if the voltage on the device is increased past the breakdown voltage to a critical level, the increasing electric field may result in runaway generation of charge carriers within the semiconductor device, leading to avalanche breakdown. When avalanche breakdown occurs, the current increases sharply and may become uncontrollable, and an avalanche breakdown event may damage or destroy the semiconductor device.

Figure 9B:
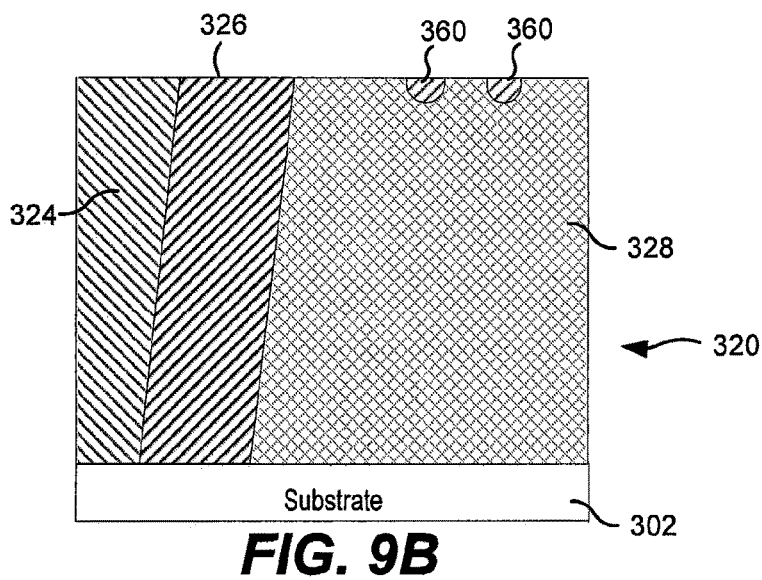
FIG. 9B is a cross-sectional diagram taken along line 9B-9B of FIG. 9A.

In order to reduce this electric field crowding (and the resulting increased leakage currents), edge termination structures such as the guard rings 360 may be provided that surround part or all of the active region of a power semiconductor device. These edge termination structures may be designed to spread the electric field out over a greater area, thereby reducing the electric field crowding. Guard rings are one known type of edge termination structure. As shown in FIG. 9B, which is a cross-sectional diagram taken along line 9B-9B of FIG. 9A, the guard rings 360 may comprise spaced-apart p-type trenches 360 that are formed in an upper portion of the more lightly doped n-type edge portion 328 of the silicon carbide drift region 320 that surrounds the active region of the semiconductor device 300. The more lightly doped n-type edge portion 328 of the silicon carbide drift region 320 may be doped during the growth of the drift region 320 (in which case the entire drift layer 320 would start out lightly doped and then have the more heavily doped n-type and p-type pillars 324, 326 formed therein via ion implantation). While FIGS. 9A and 9B illustrate a power semiconductor device 300 that uses two guard rings 360 as an edge termination structure, it will be appreciated that any appropriate edge termination structure may be used. For example, in other embodiments, the guard rings 360 may be replaced with a junction termination extension. It will also be appreciated that the edge termination structure may be omitted in some embodiments.

Figure 10:
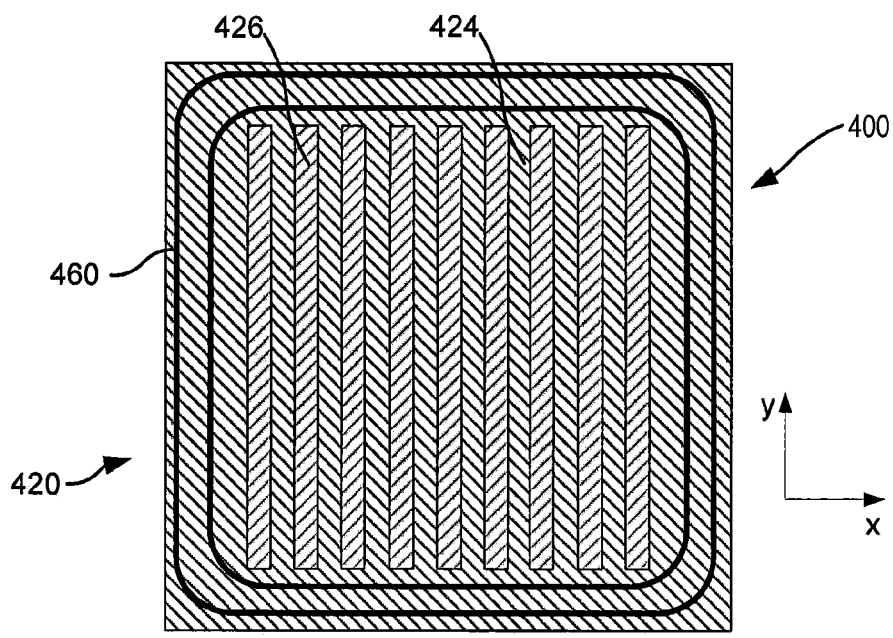
FIG. 10 is a schematic plan view of another power semiconductor device that has a superjunction-type drift region according to embodiments of the present invention.

While in the embodiment of FIGS. 9A and 9B the n-type pillars 324 are formed via ion implantation, it will be appreciated that in other embodiments the drift region may be grown as an n-type layer having a doping concentration consistent with a desired doping concentration for the n-type pillars, and then the p-type pillars may be formed by ion-implantation. FIG. 10 is a schematic plan view of a power semiconductor device 400 that has a superjunction-type drift region 420 according to embodiments of the present invention that is formed in this manner (with the topside metallization and active structures omitted). As shown in FIG. 10, in this embodiment the n-type pillars 424 may directly connect to a peripheral portion of the drift region 420 that includes the junction termination structures 460 since the drift region 420 may be evenly doped n-type except for the regions thereof into which p-type dopants are implanted to form the p-type pillars 426.

Figure 11:
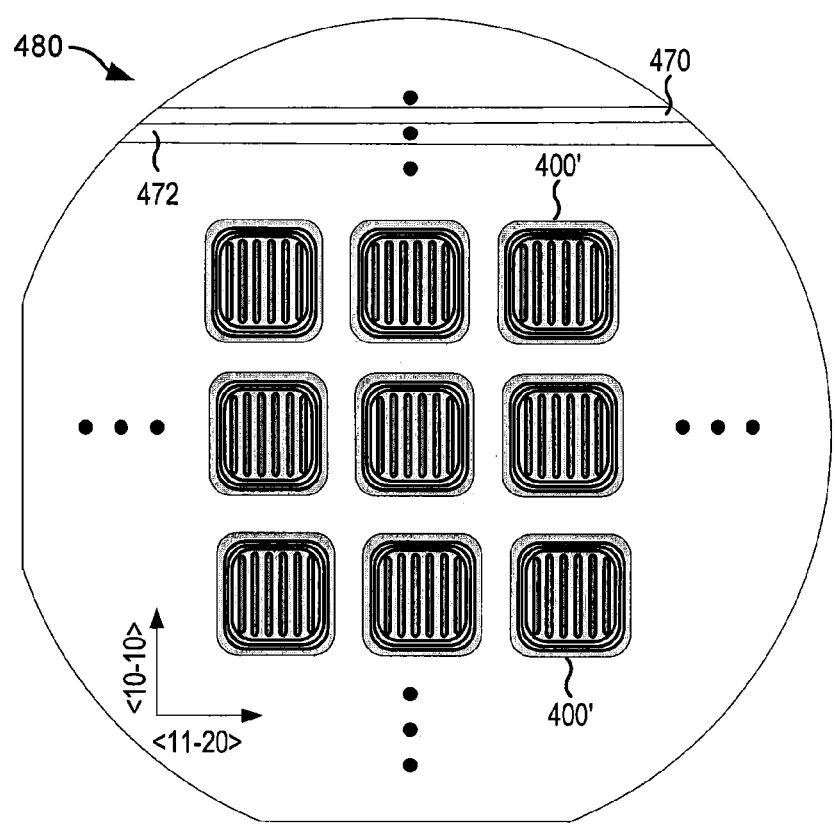
FIG. 11 is a schematic plan view of a semiconductor wafer that has a plurality of power semiconductor devices according to embodiments of the invention formed thereon.

FIG. 11 is a schematic plan view of a 4H silicon carbide wafer 480 that has a plurality of power semiconductor devices 400' according to embodiments of the invention formed thereon. The power semiconductor devices 400' are similar to the power semiconductor devices 400 that are discussed above, but include an extra guard ring and also have slightly differently shaped pillars. It will be appreciated that any of the power semiconductor devices according to embodiments of the present invention could be used in place of the power semiconductor devices 400'.

The power semiconductor devices 400' may, for example, be formed in rows and columns on the wafer 480. The wafer 480 may be cut from a boule of material so that the top surface of the wafer 480 is along a crystallographic plane that extends in the <10-10> crystallographic direction (from top to bottom in the plan view of FIG. 11) and along the <11-20> crystallographic direction (from left to right in the plan view of FIG. 11). While not shown in FIG. 11, more typically the wafer 480 will be cut at a small off-cut angle from this plane, such as a 4° off-cut angle. As shown in FIG. 11, the power semiconductor devices 400' can be oriented on the wafer 480 so that the bar-shaped pillars thereof extend perpendicular to the <11-20> crystallographic direction and parallel to the <10-10> crystallographic direction in some embodiments. Other orientations may also be used.

As is discussed above with reference to FIGS. 5A-5B, an ion implantation device is set at a specific angle to the plane defined by the top surface of a wafer structure (e.g., a 4H silicon carbide wafer with an epitaxially grown silicon carbide drift layer thereon) that will be used to form one or more power semiconductor devices, and at a desired rotational angle around the circumference of the wafer structure. These angles are selected so that channels exist in the crystal lattice of the wafer structure along the axis of implantation (i.e., along the direction that the ions are shot into the crystal lattice). However, it will be understood that once the ion implantation device is set at the appropriate angular relationship with respect to the wafer structure, the ion implantation device can only implant a small portion of the wafer structure, as the ion beam is much smaller than the wafer.

Pursuant to embodiments of the present invention, the ion implantation device may be moved in a first direction (e.g., along the <11-20> crystallographic axis) so as to implant ions at desired locations across a first "row" of the wafer structure. This is shown graphically in FIG. 11 by a first row 470 that illustrates the region of the wafer that may be implanted as the ion implantation device is moved along the first direction. The ion implantation device will not implant ions at all locations along this first row, but instead only at locations where the specific type of ion being implanted are supposed to be implanted. Once all appropriate locations in the first row 470 have been implanted, then the wafer may be moved in a second direction with respect to the ion implantation device so that the ion implantation device can then be moved horizontally to implant ions in appropriate locations across a second row, such as row 472 in FIG. 11. In this fashion, all appropriate regions of the wafer 480 may be implanted at an appropriate angle where channeling will occur.

Figure 12A:
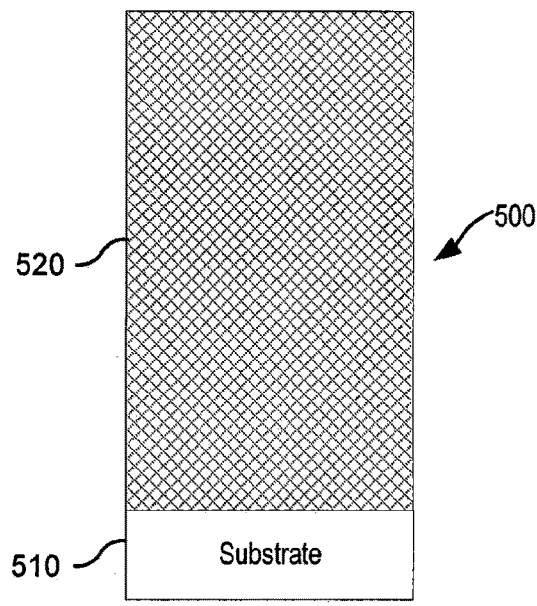
FIGS. 12A-12F are schematic cross-sectional diagrams that illustrate a method of fabricating a power semiconductor device according to embodiments of the present invention.
Figure 12B:
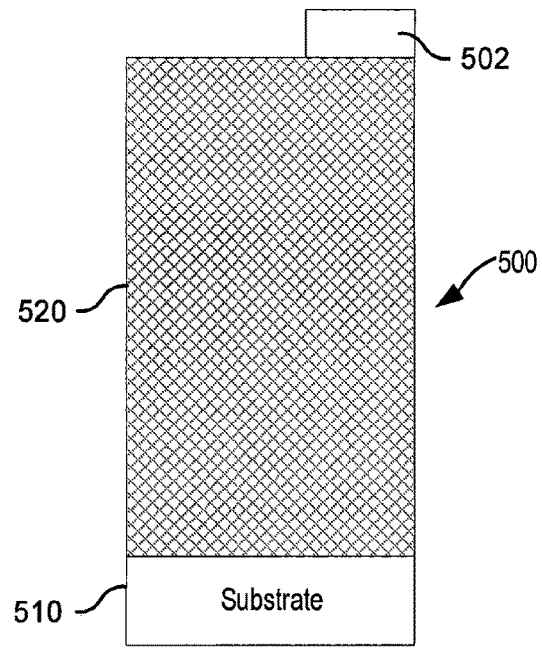
Figure 12C:
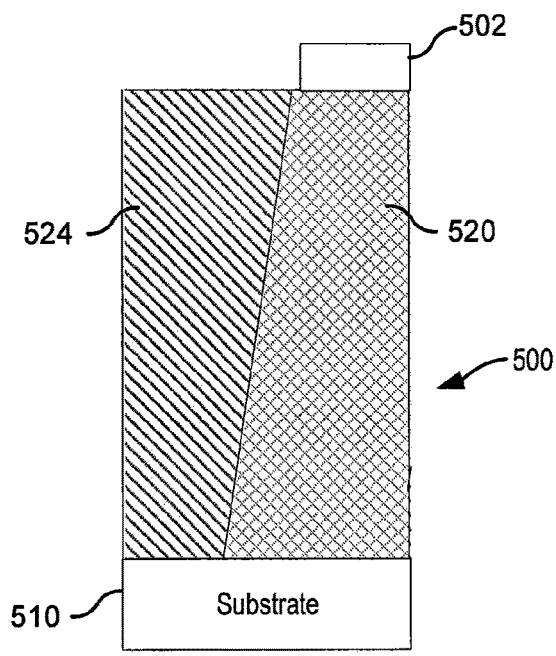

FIGS. 12A-12F are schematic cross-sectional diagrams that illustrate a method of fabricating a power semiconductor device 500 according to embodiments of the present invention. As shown in FIG. 12A, an n-type drift region 520 is epitaxially grown on a 4H silicon carbide substrate 510. In some embodiments, the drift region 520 may be doped during growth with n-type impurities to a concentration of, for example, between $1\times10^{15}/cm^3$ and $1\times10^{19}/cm^3$. Referring to FIG. 12B, next, a first ion implantation mask 502 may be formed on the drift region 520, and this mask 502 may then be patterned via, for example, photolithography. Referring to FIG. 12C, n-type dopants may be implanted into the drift region 520 to form a plurality of n-type pillars 524. The n-type dopants may be implanted at a predetermined angle with respect to the top surface of the drift region 520 in order to implant the ions in channels that appear at the selected angle in the crystal lattice. For example, the n-type dopant ions can be implanted along the <11-23> crystallographic axis or along one of the other five symmetrically equivalent crystallographic axes where large channels are seen in the lattice structure. The ion implantation technique described above with respect to FIG. 11 may be used to implant the n-type dopant ions in all regions of a wafer that includes the power semiconductor device 500 where n-type dopants are to be implanted in the drift region for forming a superjunction structure. As the n-type dopant ions are implanted at an angle with respect to the top surface of the device 500, the n-type pillar 524 has a pair of slanted sidewalls (only one of which is visible in FIG. 12C).

Figure 12D:
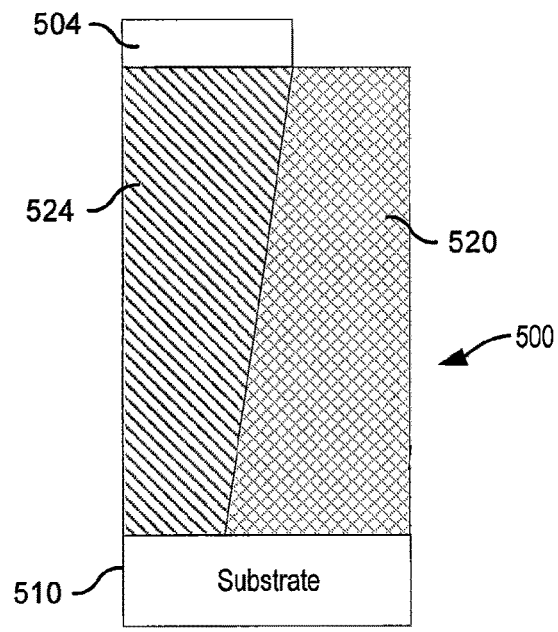
Figure 12E:
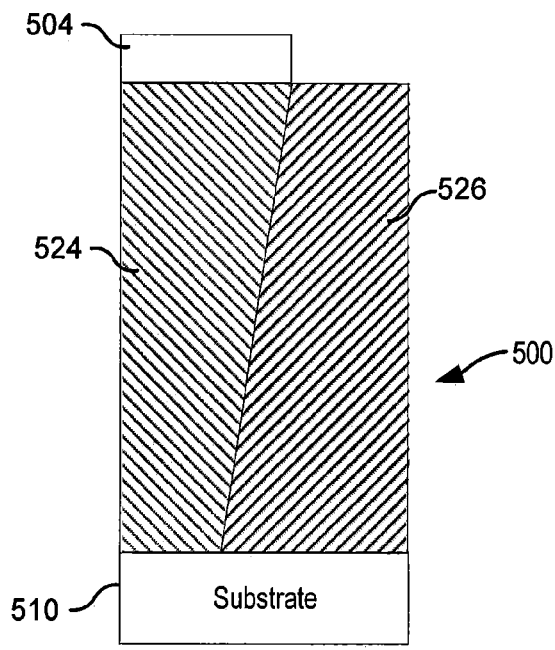

The first ion implantation mask 502 may then be removed. Referring to FIG. 12D, next, a second ion implantation mask 504 may be formed on the drift region 520, and this mask 504 may then be patterned via, for example, photolithography. Referring to FIG. 12E, p-type dopants may be implanted into the drift region 520 to form a plurality of p-type pillars 526 (only one of which is shown in FIG. 12E). The p-type dopants may also be implanted at a predetermined angle with respect to the top surface of the drift region 520 in order to implant the ions in channels that appear at the selected angle in the crystal lattice. For example, the p-type dopant ions can be implanted at the same angle as the n-type dopants. The ion implantation technique described above with respect to FIG. 11 may be used to implant the p-type dopant ions in all regions of a wafer that includes the power semiconductor device 500 where p-type dopants are to be implanted in the drift region for forming a superjunction structure. As the p-type dopant ions are implanted at an angle with respect to the top surface of the device 500, the p-type pillar 526 has a pair of slanted sidewalls (only one of which is visible in FIG. 12E). The p-type pillar 526 may directly contact the n-type pillar 524.

The second ion implantation mask 504 may then be removed. Via these steps, a semiconductor device is formed that has one or more n-type silicon carbide pillars 524 and one or more p-type silicon carbide pillars 526 that together form a superjunction structure in the drift region 520.

Figure 12F:
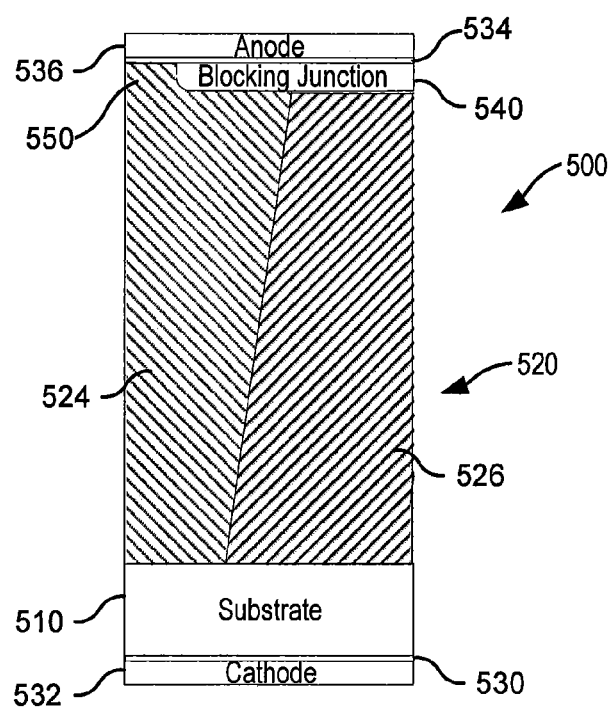

Referring to FIG. 12F, a heavily-doped p-type region may be formed in an upper portion of at least the p-type silicon carbide pillar 526 in order to form a blocking junction 540. The blocking junction 540 defines a channel region 550 in an upper portion of the n-type silicon carbide pillar 524. When the semiconductor device 500 is in its on state, current will flow through the channel region 550. Contact structures may also be added to the device. As shown in FIG. 12F, the contact structures may include, for example, an ohmic contact layer 530 that is on a bottom surface of the substrate 510, a cathode contact 532 that is on the ohmic contact layer 530, a Schottky contact layer 534 that is on a top surface of the drift region 520, and an anode contact 536 that is on the Schottky contact layer 534.

Figure 13:
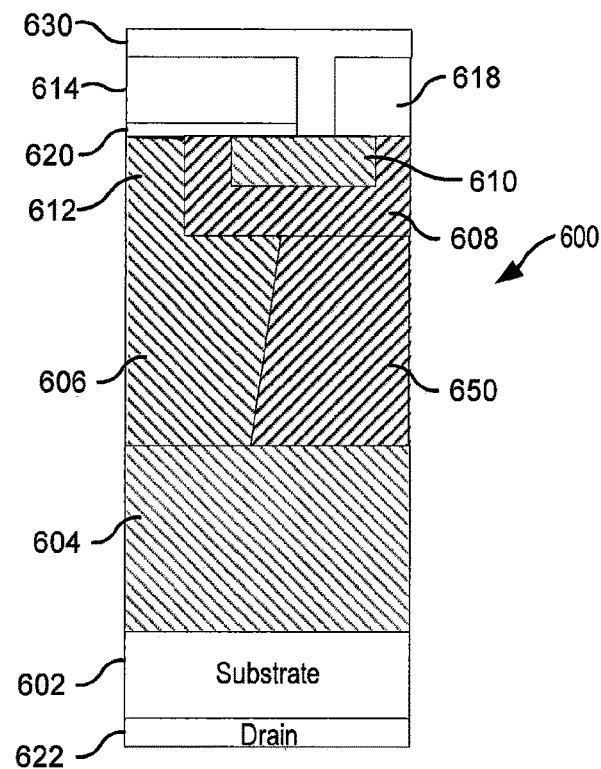
FIG. 13 is a schematic cross-sectional diagram of a power semiconductor device according to further embodiments of the present invention.

Another exemplary device 600 according to embodiments of the present invention is shown in FIG. 13. The device 600 shown in FIG. 13 is a power DMOSFET that has various regions that can be formed by ion implantation.

As shown in FIG. 13, the device 600 includes an n+ substrate 602, and an n-type drift layer 604 having a doping concentration of about $1.5 \times 10^{16}$ cm$^{-3}$ on the substrate 602. The drift layer 604 has a thickness of about 5 microns. An n-type current spreading layer 606 having a thickness of about 5 microns and a doping concentration of about $7 \times 10^{16}$ cm$^3$ is on the drift layer 604. The drift layer 604 and the n-type current spreading layer 606 may together form a drift region of the device 600.

A p+ well region 608 is formed in the n-type spreading layer 606, and an n+ source region 610 is formed in the p+ well region 608. The n+ source region 610 is degeneratively doped to have a doping concentration greater than about $1 \times 10^{20}$ cm$^{-3}$. Likewise, the p+ well region 608 is degeneratively doped to have a doping concentration greater than about $1 \times 10^{20}$ cm$^{-3}$. An n-type JFET implant region 612 is formed in the n-type current spreading layer 606 adjacent the p+ well region 608. The n-type JFET region 612 has a doping concentration that is greater than the doping concentration of the n-type current spreading layer 606. A gate insulating layer 620 is on the n-type current spreading layer 606, and a gate contact 614 is on the gate insulating layer 620. A source contact 618 is formed on the n+ source region 610 and contacts the p+ well region 608. A drain contact 622 is formed on the substrate 602.

The device 600 further includes a deep p-implanted region 650 beneath the p+ well 608. The deep p-implanted region 650 may have a doping concentration of about $1 \times 10^{17}$ cm$^{-3}$. The deep p-implanted region 650 may extend to a depth of about 4.5 microns into the drift region. The deep p-type layer 650 may not be so deep, however, as to extend completely through the n-type spreading layer 606. The deep p-type implanted region 650 may be formed by channeled ion implantation as described above. The deep p-type implanted region 650 may comprise a p-type pillar. The portion of the current spreading layer 606 that is adjacent the deep p-type implanted region 650 may comprise an n-type pillar. These pillars may form a superjunction structure in the drift region. The pillars may be slanted pillars.

Because of this superjunction structure, the top portion of the drift region (i.e., the n-type spreading layer 606) can be doped more heavily than would otherwise be possible for a conventional structure. This enables the device 600 to have lower on-state resistance than would otherwise be possible for a given blocking voltage.

As noted above, the angle of implantation with respect to the top surface of the 4H silicon carbide layer structure will depend upon how the 4H silicon carbide wafer that forms the substrate is cut from the boule. If the wafer is cut along the plane defined by the <10-10> and <11-20> crystallographic axes (i.e., a plane the is perpendicular to the <0001> crystallographic axis), then the implant angle may be an angle of approximately 17°. If the 4H silicon carbide wafer is cut at an angle of 4° from the plane defined by the <10-10> and <11-20> crystallographic axes, then the implant angle will either be about 13° or about 21° (if the implantation is done along the <11-23> crystallographic axis) depending upon the direction of the 4° off-cut. The implant angle for the five crystallographic axes that are symmetrically equivalent to the <11-23> crystallographic axis may be determined by simple geometry for such off-cut wafers. It will likewise be appreciated that the wafer may be cut at angles other than an angle of 4° from the plane defined by the <10-10> and <11-20> crystallographic axes, which will result in a corresponding change in the implant angle relative to the plane defined by the upper surface of the silicon carbide layer structure. Typically it would be expected that the implant angle will be within the range of about 6° to about 35° from the plane defined by the top surface of the silicon carbide layer structure.

Figure 14:
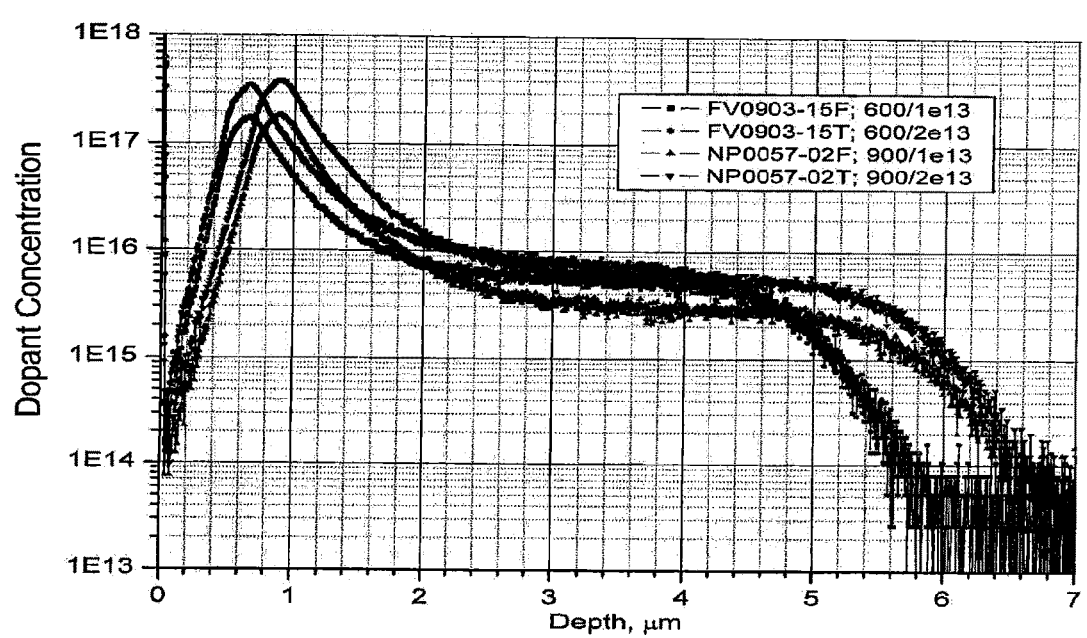
FIG. 14 is a graph of SIMS data illustrating implanted dopant concentrations for $^{27}$Al ions implanted into 4H silicon carbide along the <11-23> crystallographic axis using the techniques according to embodiments of the present invention.

FIG. 14 is a graph of SIMS data showing the concentration of $^{27}$AL per cm$^{-3}$ for several 4H silicon carbide layer structures that were formed using the ion implantation techniques according to embodiments of the present invention. In dopant ions were implanted along the <11-23> crystallographic axis. The ions were implanted at an implant energies of 600 keV and 900 keV. As can be seen in FIG. 14, implant depths of about 5.5 to 6.5 microns were achieved in all four cases. These implant depths far exceed the implant depths that can be achieved using a similar implant energy and conventional techniques.

Figure 15A:
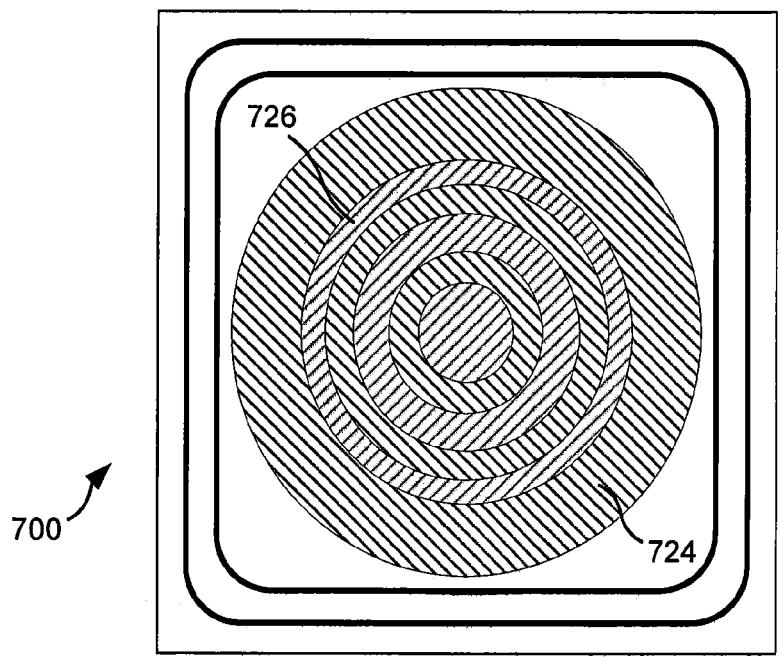
FIGS. 15A-15B are schematic plan views of power semiconductor devices having alternative superjunction pillar structures according to embodiments of the present invention.
Figure 15B:
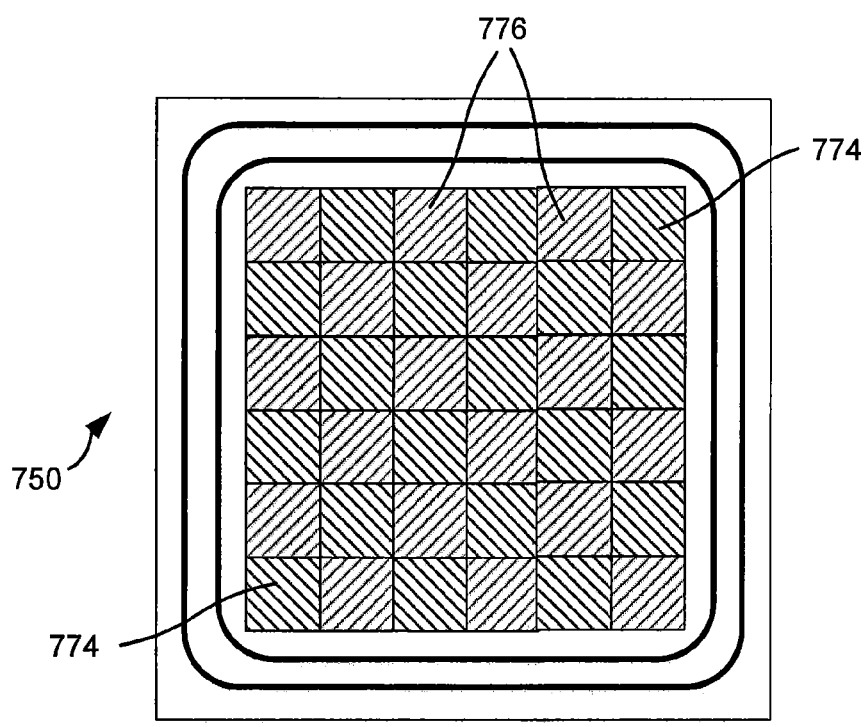

It will also be appreciated that embodiments of the present invention are not limited to superjunction structures that are implemented using fin-like pillars of n-type and p-type material in the drift region. For example, FIGS. 15A and 15B illustrate two additional example superjunction structures that can be formed using the channeled ion implantation techniques according to embodiments of the present invention that have other shaped p-type and n-type regions in the drift region. In particular, FIG. 15A is a schematic plan view of the upper surface of a drift region of a power semiconductor device 700 that includes a superjunction structure in the form of alternating circular rings of n-type 724 and p-type 726 material as opposed to fin-shaped pillars. Likewise FIG. 15B is a schematic pillar schematic plan view of the upper surface of a drift region of a power semiconductor device 750 that includes a superjunction structure in the form of a plurality of column-shaped pillars of n-type 774 and p-type 776 material formed in a checkerboard pattern. In each case, the rings or columns include sidewalls that are at an angle of 17° with respect to the <0001> crystallographic axis or at another angle that facilitates deep channeling of the dopant ions such as an angle of 90° from the <0001> crystallographic axis (i.e., along the <11-20> crystallographic axis).

The ion implantation techniques according to embodiments of the present invention may be used to form devices having superjunctions having thicknesses of, for example, 2 microns to 10, 15, 20 microns or more that are formed using a single ion implantation step for each type of dopant ion that is implanted. The alternating n-type and p-type pillars in the drift regions may have widths of between, for example, 1 micron and 50 microns. Moreover, the process could be repeated multiple times with the pillars formed in each step of the process aligned to create devices having even deeper implants. For example, after the ion implantation process set forth in FIGS. 12A-12E is performed, another silicon carbide layer could be epitaxially grown on top of the initial epitaxial layer. The ion implantation steps could then be repeated with respect to this second epitaxial layer to form a thicker drift region having a superjunction structure extending throughout. This process of growing and then implanting could be repeated additional times.

Figure 16:
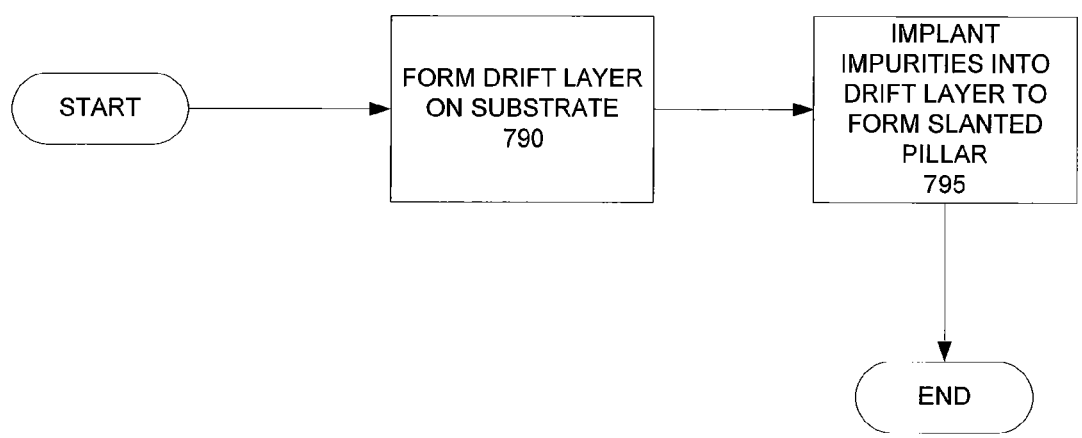
FIG. 16 is a flow chart that illustrates a method of fabricating a power semiconductor device having a superjunction-type drift region according to embodiments of the present invention.

FIG. 16 is a flow chart that illustrates a method of fabricating a power semiconductor device having a superjunction-type drift region according to embodiments of the present invention. As shown in FIG. 16, operations may begin with formation of a 4H silicon carbide drift layer that is doped with impurities having a first conductivity type on a 4H silicon carbide substrate (Block 790). The drift layer may be formed, for example, by epitaxial growth. In some embodiments, the silicon carbide substrate may be an off-cut silicon carbide wafer that is cut at an angle of, for example, 2° to 8° from the plane defined by the <10-10> and the <11-20> crystallographic axes of the silicon carbide substrate. In other embodiments, the silicon carbide substrate may be off-cut at other angles or may instead be cut along the plane defined by the <10-10> and the <11-20> crystallographic axes.

Next, impurities having a second conductivity type that is opposite the first conductivity type are implanted into selected portions of the drift layer (Block 795). The drift layer may have a planar upper surface and the impurities may be implanted into selected portions of the planar upper surface of the drift layer using an ion implantation mask. The impurities may be implanted at an angle that is within +/−1.5° of the <11-23> crystallographic axis or of one of the other five symmetrically equivalent crystallographic axes to facilitate deep channeling of the second conductivity type dopant ions. This implantation step may form at least one second conductivity type pillar within the drift layer that is part of a superjunction structure. The second conductivity type pillar may have a sidewall that is slanted with respect to the upper surface of the 4H silicon carbide drift layer.

While example embodiments above describe certain favorable ion implantation angles that may result in deep channeling of dopant ions, it will be appreciated that other angles may be used that may also provide such channeling. For example, it is believed that some degree of channeling will occur when implants are performed at an angle of 17° from the <0001> crystallographic axis at rotation angles about the above-described cone defined by the 17° angle at locations midway between the six crystallographic axes discussed above in which the channels that are shown in FIG. 3B above are formed. Thus, it will be appreciated that the present disclosure is not limited to the implant angles that are specifically identified above.

Pursuant to still further embodiments of the present invention, different portions of a 4H silicon carbide wafer could be implanted at different rotational angles. For example, referring again to FIG. 5A, in 4H silicon carbide there are six symmetrically equivalent crystallographic axes that will have a lattice structure that appears as shown in FIG. 3B. In some embodiments, different parts of a wafer may be implanted at different ones of these rotational angles. Such a technique may be used so that, for example, all of the pillars that are formed tilt inwardly toward the center of the wafer. As the end pillars may see a different electrical field, tilting the pillars away from the edges of the wafer may be advantageous.

Embodiments of the present invention have been discussed above with reference to example embodiments in the form of JBS diodes and power MOSFETs. However, it will be appreciated that other power semiconductor devices such as, for example, Schottky diodes, JFETs, BJTs, PiN diodes, metal semiconductor field effect transistors (MESFETs), GTOs, IGBTs, MOS-controlled thyristors and other power semiconductor devices may be formed to have superjunction drift regions according to the embodiments of the present invention.

While the above embodiments of the present invention have primarily been discussed with reference to 4H silicon carbide devices, it will be appreciated that the above techniques may also be used on other types of silicon carbide including 2H silicon carbide, 6H silicon carbide, 3C silicon carbide and 15R silicon carbide. Thus, it will be appreciated that the implantation angles may be varied appropriately for 2H and 6H silicon carbide, and the crystallographic axes and implantation angles may be varied appropriately for 3C and 15R silicon carbide. For example, while the <11-23> crystallographic axis (and its equivalent crystallographic axes) is at an angle of 17° with respect to the <0001> crystallographic axis in 4H silicon carbide, the angle between the <11-23> crystallographic axis (and its equivalent crystallographic axes) and the <0001> crystallographic axis is about 31.4° for 2H silicon carbide and is about 11.5° for 6H silicon carbide. Thus, the degree to which the above-described sidewalls of various semiconductor pillars are slanted with respect to the <0001> crystallographic axis may depend upon the type of silicon carbide used.

As discussed above, according to some embodiments, when 4H silicon carbide is used, the pillars that are formed may have sidewalls that are slanted at an angle of between 15.5° and 18.5° from the <0001> crystallographic axis. When 2H silicon carbide is used instead of 4H silicon carbide, the implantation angles may be appropriately varied and the pillars may have sidewalls that are slanted at an angle of between, for example, 30° and 33° with respect to the <0001> crystallographic axis. Similarly, when 6H silicon carbide is used instead of 4H silicon carbide, the implantation angles may be appropriately varied and the pillars may have sidewalls that are slanted at an angle of between, for example, 10° and 13° with respect to the <0001> crystallographic axis. Thus it will be appreciated that the embodiments of the present invention described above with respect to 4H silicon carbide are equally applicable to other types of silicon carbide with such appropriate adjustments to account for the different angles between the crystallographic axes.

With respect to 3C silicon carbide, and using the cubic notation for the structure, tilting away from the <001> crystallographic axis by 45° may provide enhanced channeling along the <110> family of crystallographic planes. Likewise, tilting away from the <001> crystallographic axis by 35.3° may provide enhanced channeling along the <111> family of crystallographic planes. Thus, with respect to 3C silicon carbide, the pillars may have sidewalls that are slanted at an angle of between, for example, 34° and 37° or between 43° and 47° with respect to the <001> crystallographic plane.

Pursuant to further embodiments of the present invention, power silicon carbide based Junction Barrier Schottky (JBS) diodes are provided that may exhibit improved performance. The JBS diodes according to these embodiments of the present invention may have deeply implanted p-type wells that are implanted with p-type dopants such as aluminum, boron, gallium, indium or the like. In some embodiments, these p-wells may have a depth in excess of 2 microns. In other embodiments, the p-walls may have a depth in excess of 3 microns. For example, the p-wells may have a depth of between 3-5 microns in some embodiments and may have a depth of between 2-5 microns in other embodiments. The doping profiles of the deep implants may be selected to provide a quasi charge balance to an n-type drift layer of the device, thereby providing enhanced performance.

The above-described JBS diodes and various other power semiconductor devices according to embodiments of the present invention may be fabricated using multi-step channeled ion implantation techniques to form deeply-implanted regions that have unique and desirable doping profiles. These devices formed using these techniques may be silicon carbide power semiconductor devices in some embodiments. The power semiconductor devices according to these embodiments of the present invention may exhibit improved performance such as decreased power dissipation, lower leakage current and/or improved reverse breakdown voltage performance as compared to conventional power semiconductor devices. In some embodiments, the devices may be formed using a two-step ion implantation process where the ions are implanted using channeling techniques in at least one of the two ion implantation steps. A first step of the multi-step ion implantation process may implant ions at a relatively high implantation energy, while a second step of the multi-step ion implantation process may implant ions at a lower implantation energy. This technique may be used to achieve desired implant profiles that improve the performance of the device.

These embodiments of the present invention will now be discussed in further detail with reference to FIGS. 17-27.

Figure 17:
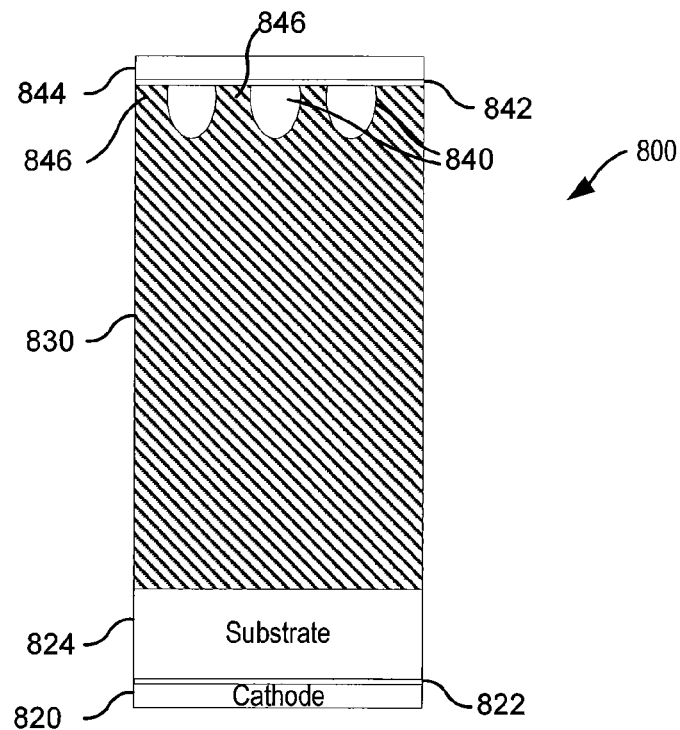
FIG. 17 is a schematic cross-sectional view of a JBS diode.

FIG. 17 is a cross-sectional view of a power semiconductor device in the form of a JBS diode 800. As shown in FIG. 17, the JBS diode 800 includes a cathode contact 820, an ohmic contact layer 822, an n-type substrate 824, a drift region 830, a plurality of p-type blocking junctions 840 that define channel regions 846, a Schottky contact 842 and an anode contact 844. The n-type substrate 824 may comprise a silicon carbide substrate that is heavily doped with n-type impurities such as nitrogen or phosphorous. The drift region 830 may be an epitaxially grown n-type silicon carbide semiconductor region. The cathode contact 820 and the anode contact 844 may each comprise a highly conductive metal layer. The Schottky contact 842 may comprise a layer that forms a Schottky junction with the drift region 830 and may comprise, for example, a titanium layer. The ohmic contact layer 822 may comprise a metal that forms an ohmic contact to n-type silicon carbide so as to form an ohmic contact to the silicon carbide substrate 824. The p-type blocking junctions 840 may comprise p-type implanted regions in an upper portion of the drift region 830 that are heavily implanted with p-type dopants. The channel regions 846 are positioned adjacent the p-type blocking junctions 840. The channel regions 846 pass current when the JBS diode 800 is in its forward on-state and block voltage when the JBS diode 800 is in its reverse blocking state.

Figure 18:
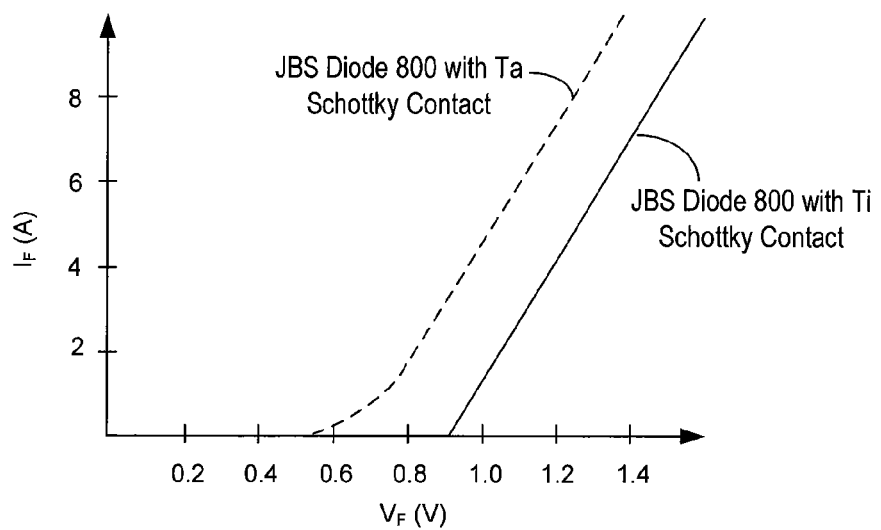
FIG. 18 are graphs of the forward operation current-voltage (I-V") characteristics of JBS diodes having the design of FIG. 17 that are implemented with titanium and tantalum Schottky contacts.

FIG. 18 is a graph illustrating the forward (on-state) current-voltage (I-V) characteristics of the JBS diode 800 of FIG. 17. As shown in FIG. 18, when the JBS diode has a turn-on or "knee" voltage of approximately 0.9 volts, which is the forward voltage at which the JBS diode 800 starts conducting current. The power dissipated in the JBS diode 800 is a function of this knee voltage.

It may be desirable to reduce the power dissipation of the JBS diode 800. As power dissipation varies linearly with voltage, one potential avenue for reducing power dissipation is to reduce the knee voltage. It has been discovered that using tantalum instead of titanium to form the Schottky contact 842 may reduce the knee voltage of the silicon carbide power JBS diode 800 of FIG. 17. In particular, as is also shown in FIG. 18, if the JBS diode 800 is formed to have a tantalum Schottky contact 842, the knee voltage may be reduced to approximately 0.6 volts. This reduction in the knee voltage may potentially result in significantly less power dissipation.

Figure 19:
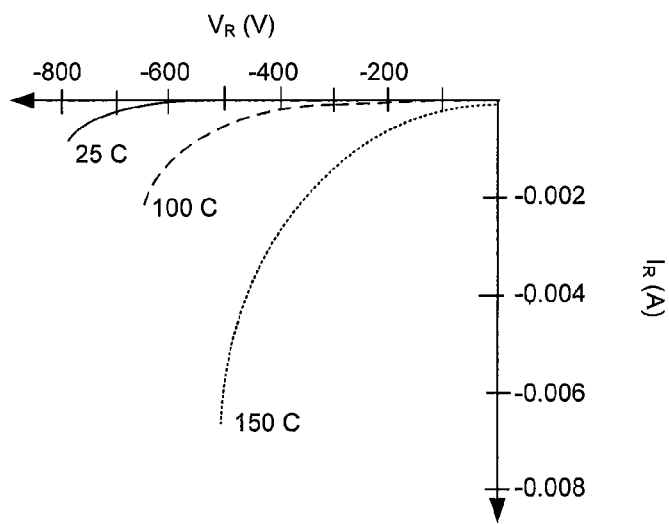
FIG. 19 is a graph of the reverse blocking I-V characteristics for several different operating temperatures for a JBS diode having the design of FIG. 17 that uses a tantalum Schottky contact.

Unfortunately, however, when a tantalum Schottky contact 842 is used, the reverse leakage current of the JBS diode 800 increases significantly, particularly at higher temperature levels. This occurs because tantalum has a lower Schottky barrier height as compared to titanium, and this lowering of the Schottky barrier height allows for increased reverse leakage currents, particularly when the device is operating at elevated temperatures. The reverse leakage performance of the JBS diode 800 with the tantalum Schottky contact 842 is shown in FIG. 19. As can be seen in FIG. 19, at 25° C., the JBS diode 800 with the tantalum Schottky contact 842 exhibits a reverse blocking voltage of over 800 volts, which is acceptable for many applications. However, when the temperature is increased to 100° C., the reverse blocking voltage is reduced to about 650 volts. Moreover, when the temperature is increased to 150° C., the reverse blocking voltage is only about 500 volts. In contrast, the JBS diode 800 with a titanium Schottky contact 842 exhibits a reverse breakdown voltage in excess of 800 volts at 150° C. Accordingly, while the use of the tantalum Schottky contact 842 can advantageously reduce the knee voltage of the JBS diode 842, the associated decrease in the Schottky barrier height results in an unacceptable increase in reverse leakage current, and hence reduction in the reverse blocking voltage of the device.

One technique that may be used for reducing reverse leakage current, and hence increasing the reverse breakdown voltage, is to increase the depth of the implanted p-type blocking junctions 840 that are formed in the upper surface of the drift region 830 underneath the Schottky contact 842. The use of more deeply implanted p-type blocking junctions may shield the Schottky interface (i.e., the junction between the Schottky contact 800 and the underlying semiconductor regions 840, 846) from high electric fields during reverse bias operation, thereby allowing the use of a tantalum Schottky contact 842 that has a reduced Schottky barrier height as compared to titanium, aluminum or other Schottky contact metals used in conventional devices. However, the use of more deeply-implanted p-type blocking junctions may result in two additional problems. First, the deeper blocking junctions may increase the on-state resistance of the device 800, which acts to increase power dissipation. Second, the deeper p-type blocking junctions may reduce the effective depth of the drift region 830, which can reduce the reverse breakdown voltage of the JBS diode 800.

Pursuant to embodiments of the present invention, deep p-type implants may be performed to form the p-type blocking junctions where the implanted regions have doping profiles that may be carefully selected to achieve a quasi-charge balance to the n-type drift region. In this fashion, a superjunction structure may be formed in the drift region. The superjunction structure may act like a series of p-n junctions that exhibit low resistance while still maintaining a high reverse breakdown voltage. The superjunction structure may be formed to extend only partially through the drift region, to avoid a potential decrease in the reverse breakdown voltage that may occur if the thickness of the drift region is effectively reduced too much by the superjunction structure. Such an embodiment of the present invention will now be described in further detail with reference to FIGS. 20-22.

Figure 20:
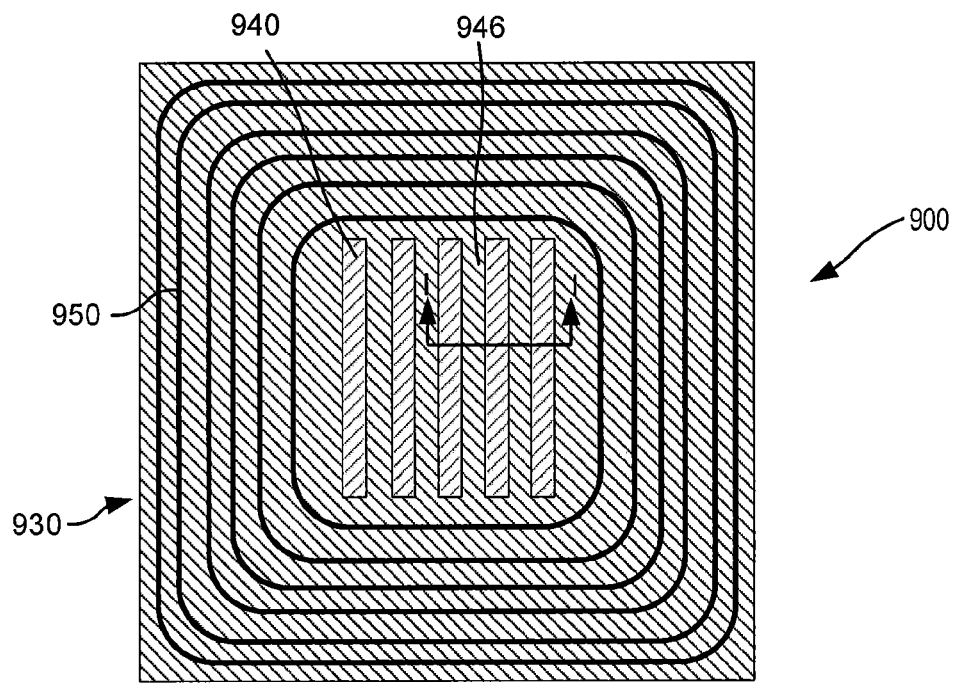
FIG. 20 is a schematic plan view of a JBS diode according to embodiments of the present invention.
Figure 21:
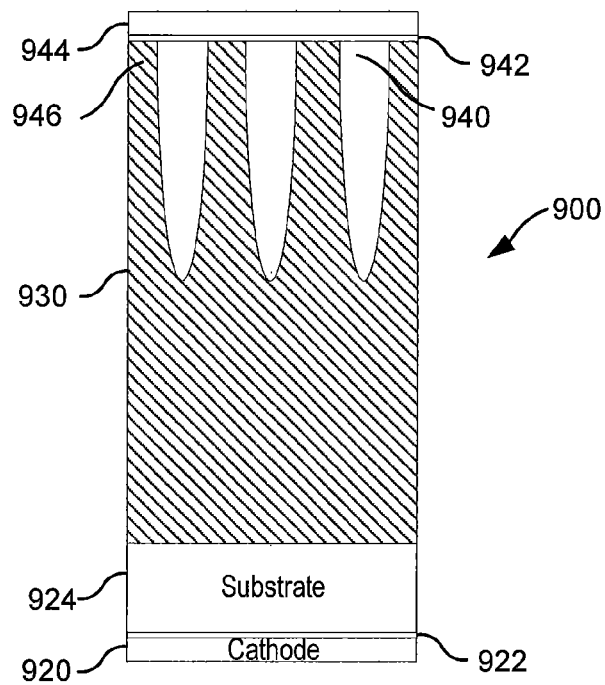
FIG. 21 is a cross-sectional view taken along the line I-I of the JBS diode of FIG. 20.
Figure 22:
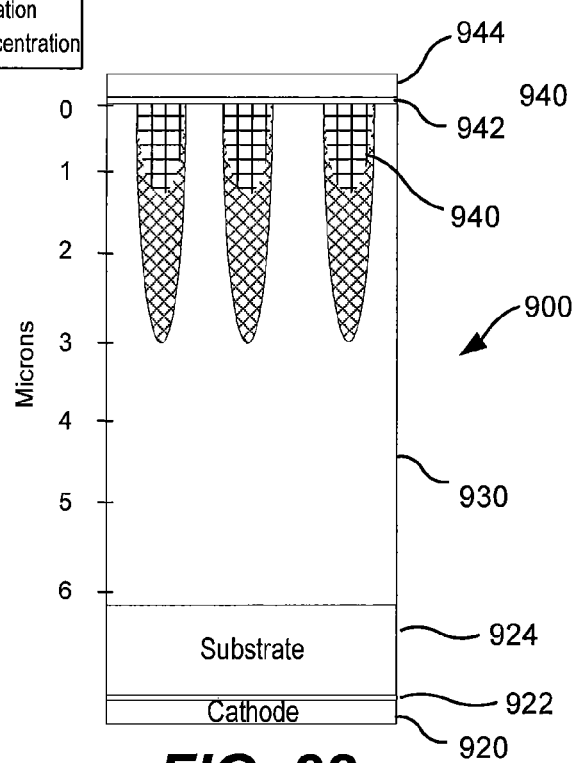
FIG. 22 is a cross-sectional view taken along the line I-I of the JBS diode of FIG. 20 that illustrates the doping concentrations of the p-type blocking junctions thereof.

In particular, FIG. 20 is a schematic plan view of a JBS diode 900 according to embodiments of the present invention with the upper metal layers thereof omitted to better illustrate the structure of the underlying semiconductor layers. FIG. 21 is a cross-sectional view taken along the line I-I of the JBS diode 900 of FIG. 21 with the upper metal layers included in the view of FIG. 21. FIG. 22 is a cross-sectional view taken along the line I-I of the JBS diode 900 of FIG. 20 that illustrates the doping concentrations throughout the device. The upper metal layers are also included in FIG. 22 for clarity.

Referring to FIGS. 20 and 21, the JBS diode 900 includes a cathode contact 920, an ohmic contact layer 922, an n-type substrate 924, a drift region 930 a plurality of p-type blocking junctions 940 that define channel regions 946, a Schottky contact 942 and an anode contact 944. The cathode contact 920, the ohmic contact layer 922, the substrate 924, the drift region 930, and the anode contact 944 may be identical to their corresponding elements in the JBS diode 800 of FIG. 17, and hence further description thereof will be omitted. The JBS diode 900 also includes guard rings 950 which serve as an edge termination for protection against avalanche breakdown.

The JBS diode 900 differs from the JBS diode 800 in that it may include a tantalum Schottky contact 942 in some embodiments. As discussed above, the use of such a tantalum Schottky contact 942 may reduce the knee voltage of the diode 900, thereby resulting in lower power dissipation levels during forward on-state operation. Additionally, the JBS diode 900 includes p-type blocking junctions 940 that extend significantly further into the drift region 930, and that have a different doping profile. As a result of the deeply-implanted p-type blocking junctions 940, the channel regions 946 in the JBS diode 900 differ from the channel regions 846 in the JBS diode 800 in that the channel regions 846 may extend, for example, several times further into the drift region 930. While guard rings are not shown in the JBS diode 800, it will be appreciated that the guard rings 950 included in the JBS diode 900 may extend deeper into the drift region 930 than would any corresponding guard rings in the JBS diode 800.

FIG. 22 is a schematic cross-sectional view taken along line I-I of FIG. 20 that illustrates the doping profile of the p-type blocking junctions 940 and the guard rings 950. In FIG. 22, the p-type regions correspond to the cross-hatched areas, with three different types of cross-hatching used to illustrate regions of high doping concentration, medium doping concentration and low doping concentration. It will be appreciated that FIG. 22 is schematic in nature, and that the regions of different doping concentrations do not change abruptly as suggested in FIG. 22, but instead change gradually. It will likewise be appreciated that p-type dopants will be present in low concentrations in the n-type regions due to scattering during ion implantation and/or due to diffusion. Thus, it will be appreciated that FIG. 22 is schematic in nature and is provided to show the general shapes and doping concentrations of the p-type regions as opposed to being an absolutely accurate representation of the doping concentrations.

As shown in FIG. 22, in the upper portion of the drift region 930, the implanted p-type blocking junctions 940 may have a high p-type dopant concentration. For example, in some embodiments, the upper portion of the implanted p-type blocking junctions 940 may have a doping concentration of greater than $5\times10^{17}$ cm$^{-3}$. The upper portion of each p-type blocking junction that has the relatively high doping concentration may extend, for example, between about 0.5 to about 1.5 microns into the drift region 830 from the upper surface thereof. Lower portions of the p-type blocking junctions 940 that are below the upper portions may have a doping concentration that is designed to at least quasi balance the charge in adjacent n-type portions of the drift region 930. This doping concentration may be substantially less than the doping concentration of the upper portions of the p-type blocking junctions 940. For example, in some embodiments, the lower portions of the p-type blocking junctions 940 may have a doping concentration that is at least 100 times lower than the doping concentration of the upper portions of the p-type blocking junctions 940. In other embodiments, the lower portions of the p-type blocking junctions 940 may have a doping concentration that is at least 1000 times lower than the doping concentration of the upper portions of the p-type blocking junctions 940. In some cases, the lower portions of the p-type blocking junctions 940 may have a doping concentration of less than $1\times10^{17}$ cm$^{-3}$. In an example embodiment, the upper portion of each p-type blocking junction 940 may have a doping concentration of greater than $1\times10^{18}$ cm$^{-3}$ and the lower portion of each p-type blocking junction 940 may have a doping concentration of less than $7\times10^{16}$ cm$^{-3}$. In one specific embodiment, the upper portion of each p-type blocking junction 940 may have a doping concentration of greater than $2\times10^{18}$ cm$^{-3}$ and the lower portion of each p-type blocking junction 940 may have a doping concentration of between about $3\times10^{16}$ cm$^{-3}$ to about $5\times10^{16}$ cm$^{-3}$.

The highly doped upper portion of each p-type blocking junction may generate strong electric fields during reverse blocking operation that may resist high reverse voltages. The moderately-doped lower portion of each p-type blocking junction 940 may have a doping concentration that is selected to achieve a quasi-charge balance with respect to the n-type channel regions 946 that are interposed therebetween. The lower portions of the channel regions 946 and the lower portions of the p-type blocking junctions 940 may form a superjunction structure that comprises a series of p-n junctions that exhibit low resistance while still maintaining a high reverse breakdown voltage. The p-type blocking junctions 940 only extend partially through the drift region 930. It has been discovered that devices having the aforementioned structure and doping profiles may exhibit significantly improved performance, as can be seen with reference to FIGS. 23-26. By "quasi-charge balanced" it is meant that the charge of the p-type blocking junctions 940 approximately equals the charge of the channel regions 946. It has been discovered that as long as these charges are approximately equal—for example, within 20% of each other—then the lower portions of the p-type blocking junctions 940 and the channel regions 946 therebetween may act like a superjunction, thereby reducing the conventional tradeoff between on-state resistance and reverse voltage blocking performance.

In some embodiments, the dopant profile illustrated in FIG. 22 may be achieved using a multi-step ion implantation process. One or more of these ion implantation steps may use channeling techniques. In some embodiments, the p-type dopants may be implanted along the <0001> crystallographic axis. As discussed above, silicon carbide wafers are usually offset cut as opposed to being cut at an angle perpendicular to the <0001> crystallographic plane. When the dopants are implanted along the <0001> crystallographic plane, channeling may occur, allowing for deeper implants.

Figure 23:
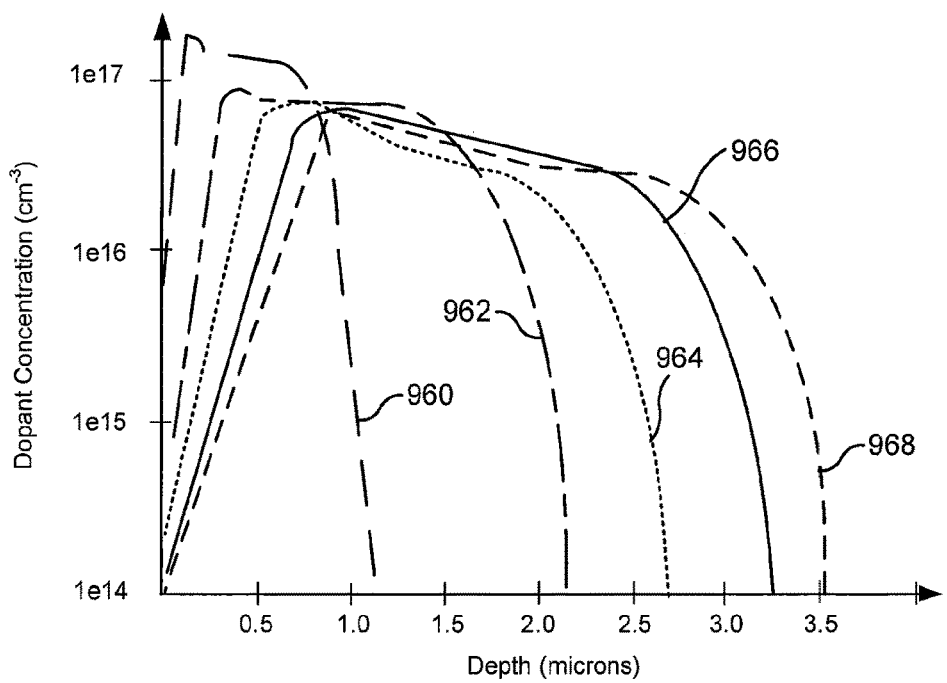
FIG. 23 is a graph illustrating the dopant concentration as a function of implantation depth for dopant implantations performed at different implantation energies using the channeling techniques according to embodiments of the present invention.

Dopants may be implanted along the <0001> crystallographic axis either by cutting the wafer perpendicular to the <0001> crystallographic plane when forming the substrate and then implanting ions in a direction perpendicular to the upper face of the substrate, or by tilting the ion implantation device relative to the substrate to compensate for an off axis cut wafer. FIG. 23 is a graph illustrating the dopant concentration as a function of depth in an n-type silicon carbide layer when the dopants are implanted along the <0001> crystallographic axis. In FIG. 23, curve 960 shows the dopant concentration as a function of depth for an implant energy of 100 keV, curve 962 shows the dopant concentration as a function of depth for an implant energy of 300 keV, curve 964 shows the dopant concentration as a function of depth for an implant energy of 500 keV, curve 966 shows the dopant concentration as a function of depth for an implant energy of 700 keV, and curve 968 shows the dopant concentration as a function of depth for an implant energy of 900 keV. Each of the five ion implantation processes illustrated in FIG. 23 were performed by implanting $^{27}Al^+$ ions into an n-type 4H silicon carbide drift region at a dose of approximately $1 \times 10^{13}$ cm$^{-2}$, with the implant performed at room temperature. $^{27}Al^+$ ions act as p-type dopants in silicon carbide.

As shown in FIG. 23, for each of five implantation processes, the dopant concentration may be low very near the surface, with the low dopant region extending deeper into the drift region the higher the implant energy used. For example, when a 900 keV implant energy is used, the dopant concentration is negligible from the upper surface of the drift region down to a depth of about 0.3 microns, and the dopant concentration does not reach $1 \times 10^{16}$ cm$^{-3}$ until a depth of about 0.8 microns.

While the dopant concentrations are very low near the surface, the concentration rises rapidly with increasing depth. As is apparent from FIG. 23, the lower the implant energy, the faster the rise in dopant concentration with increasing depth. The dopant concentration peaks at the height of this rapid rise for all five implant energies, exhibiting a small local peak, and then the dopant concentration decreases slowly over an extended depth. This characteristic of the doping profile is important because it means that the channeled implants along the <0001> crystallographic axis allow forming a deep implant that has a relatively constant concentration over a significant range of depth. At the end of the regions of relatively constant doping concentration, the dopant concentration then decrease rapidly toward zero, as can be seen at the right side of each curve in FIG. 23.

Thus, each curve 960, 962, 964, 966, 968 in FIG. 23 has a relatively flat region where the dopant concentration exhibits relatively little variation (e.g., variation of between 0-500%). This aspect of the implant profile may be used to create the moderately doped lower portion of each p-type blocking junction, since it is possible to have a substantially constant doping profile that will quasi-charge balance the n-type channel regions 946 that are between the lower portions of the p-type blocking junctions 940. For example, in one example embodiment, a 900 keV implant of p-type dopants may be performed as a first ion implantation step to form the lower portion of the p-type blocking junctions 940 that have a dopant concentration of about $5 \times 10^{16}$ cm$^{-3}$ at a depth from about 1 microns to about 3 microns, as shown by curve 968 in FIG. 23. Then, a second ion implantation step may be performed using, for example, an implantation energy of 100 keV. As shown in FIG. 23, this will form the upper portion of each p-type blocking junction 940 to have a doping concentration of about $2 \times 10^{17}$ cm$^{-3}$ from just below the surface to a depth of about 1 micron. In this fashion, a series of channeling implants may be used to obtain the doping profile shown in FIG. 22. Herein, the term "substantially constant doping profile" means that the doping concentration changes by less than one half an order of magnitude.

The multi-step channeling implant described above with reference to FIG. 23 may have several advantages. First, the implant may be performed at room temperature, which may reduce manufacturing costs. Additionally, the channeled implant may result in significantly less damage to the silicon carbide crystal, as the ions penetrate deep into the crystal with greatly reduced scattering (which causes crystal damage), and the ions are primarily slowed and stopped within the crystal lattice due to electron cloud interactions. The p-type dopants may achieve very high activation levels, such as activation levels in excess of 95% since the channeled implant facilitates implanting ions more consistently into electrically active locations within the crystal lattice. The channeled implant allows the formation of a deep junction with a relatively flat doping profile. This doping profile may facilitate forming a generally charge-balanced superjunction structure deep within the drift region that may reduce the on-resistance of the JBS diode (or other device) and which may reduce the electric field intensity at the Schottky junction, allowing for use of a lower Schottky barrier height Schottky contact. Additionally, the multi-step nature of the ion implantation process allows the formation of more heavily doped p-type regions in the upper surface of the drift region that support high reverse blocking voltage levels.

Figure 24:
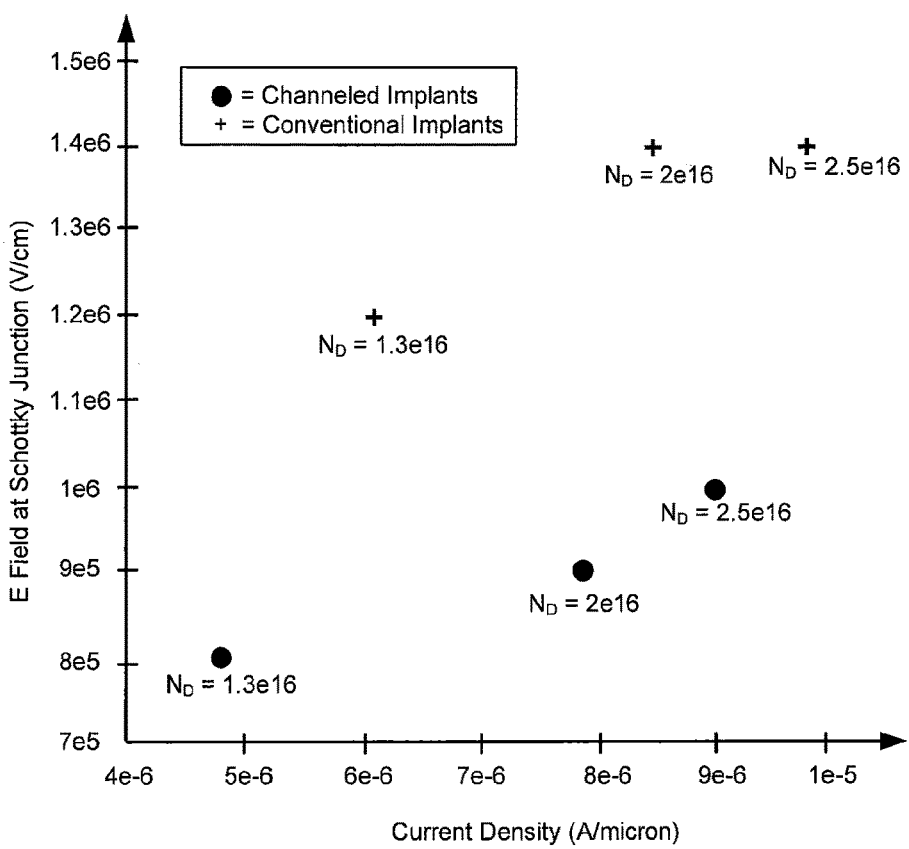
FIG. 24 is a graph of the simulated electric field intensity at the Schottky junction as a function of current density for both conventional JBS diodes and JBS diodes according to embodiments of the present invention.

FIG. 24 is a graph of the simulated electric field intensity at the Schottky junction as a function of current density for several JBS diodes having p-type blocking junctions formed using conventional ion implantation techniques and for several JBS diodes formed using the above-described channeled ion implantation techniques according to embodiments of the present invention. As discussed above, if the electric field at the Schottky junction is too high, then high leakage currents may result during reverse bias operation if a Schottky contact metal such as tantalum that has a low Schottky barrier height is used to form the Schottky contact. As shown in FIG. 24, with the conventional, state-of-the-art JBS diodes, the electric field intensity at the Schottky junction is approximately $1.4 \times 10^6$ V/cm at current densities in the of $8-9 \times 10^{-6}$ A/micron. In contrast, at the same current density, the electric field intensity at the Schottky junction in a JBS diode according to embodiments of the present invention is reduced to about $9 \times 10^5$ V/cm to $1 \times 10^6$ V/cm, or about 40% less. This reduction in the electric field is sufficient to allow the use of lower Schottky barrier height Schottky contact metals such as tantalum.

Figure 25:
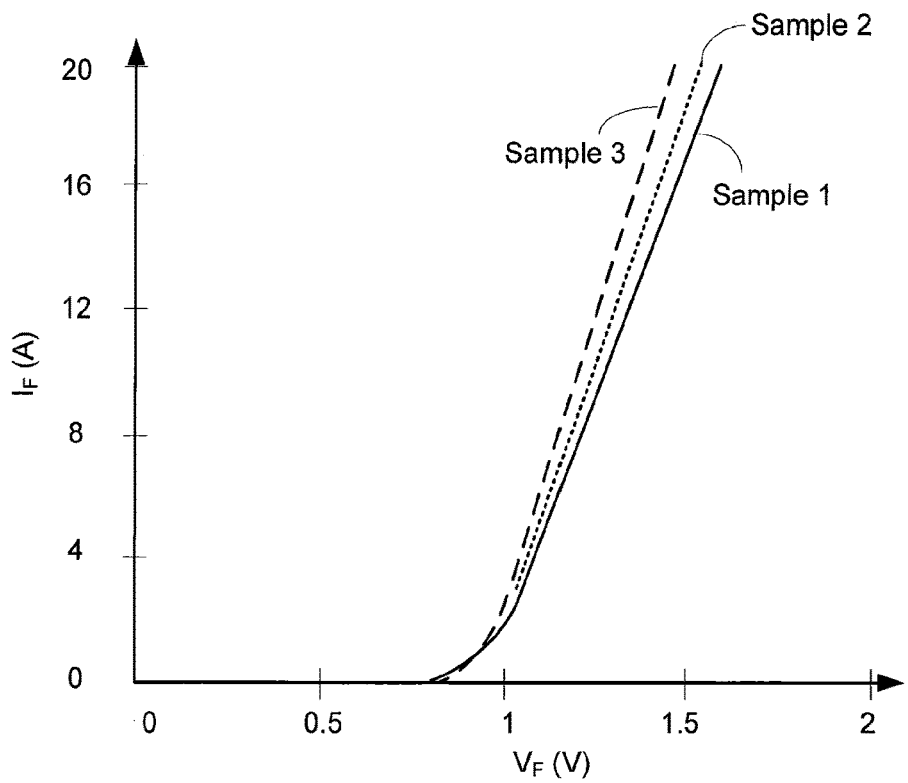
FIG. 25 is a graph showing the forward operation I-V characteristics of several JBS diodes according to embodiments of the present invention.
Figure 26:
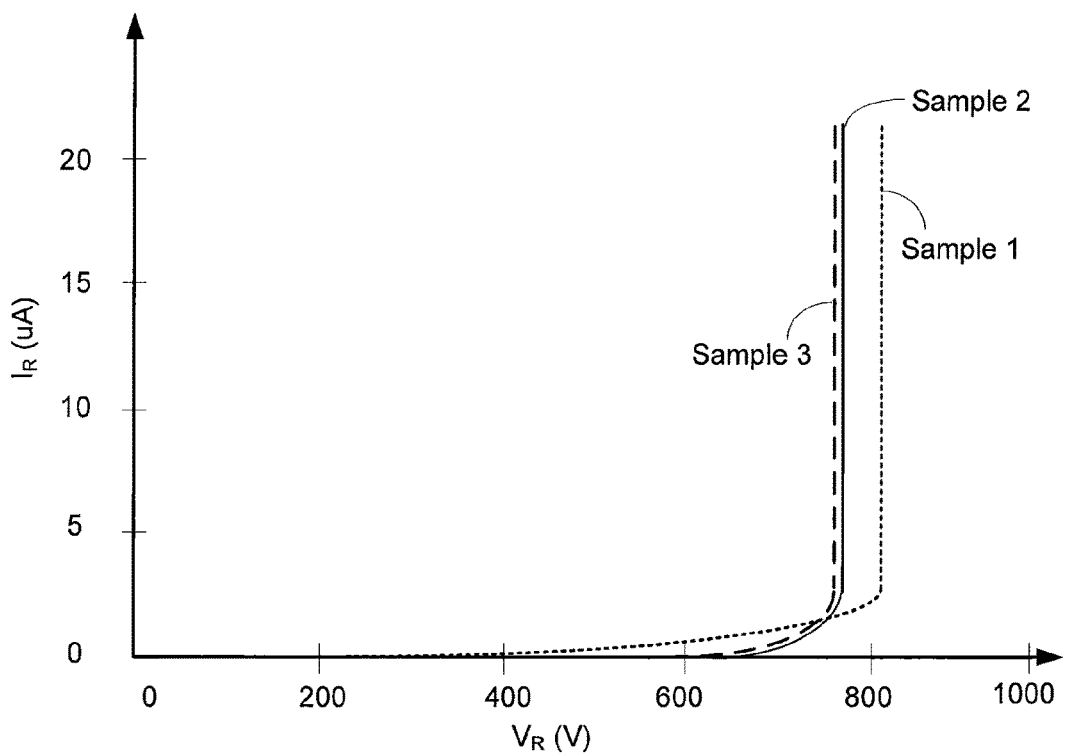
FIG. 26 is a graph showing the reverse blocking I-V characteristics of the JBS diodes used to generate the graph of FIG. 25.

FIG. 25 is a graph showing the forward operation I-V characteristics of several JBS diodes according to embodiments of the present invention. As shown in FIG. 25, the forward on-state current-voltage characteristics provide a knee voltage of about 0.7 volts. FIG. 26 is a graph showing the reverse blocking I-V characteristics of the JBS diodes used to generate the data included in FIG. 25. As shown in FIG. 26, each device exhibits a reverse blocking voltage level of more than 750 volts. Additionally, all three of the JBS diodes exhibited extremely low leakage current levels and very sharp breakdown characteristics, both of which are desirable.

It has also been discovered that the dose of the p-type implant may involve a tradeoff between the forward voltage level and the reverse leakage current of the device. In particular, higher Al doses tend to shield the Schottky interface more effectively, and hence may lower the reverse leakage current. On the other hand, lower Al doses may further reduce the knee voltage at which the device starts conducting during forward bias operations resulting in lower power dissipation levels.

While the above examples focus on JBS diodes, it will be appreciated that the multi-step channeled implants according to embodiments of the present invention may be used to fabricate other devices such as, for example, PiN diodes. It will also be appreciated that the implant techniques discussed herein may be used to form deeply implanted termination structures such as the deeply-implanted guard rings 950 included in the JBS diode 900 of FIGS. 20-21. Moreover, these techniques may also be used in other devices such as in MOSFETs where deep p-wells may be provided in order to allow for JFET regions that have lower resistance values. An example of such a device will now be described with reference to FIG. 27.

Figure 27:
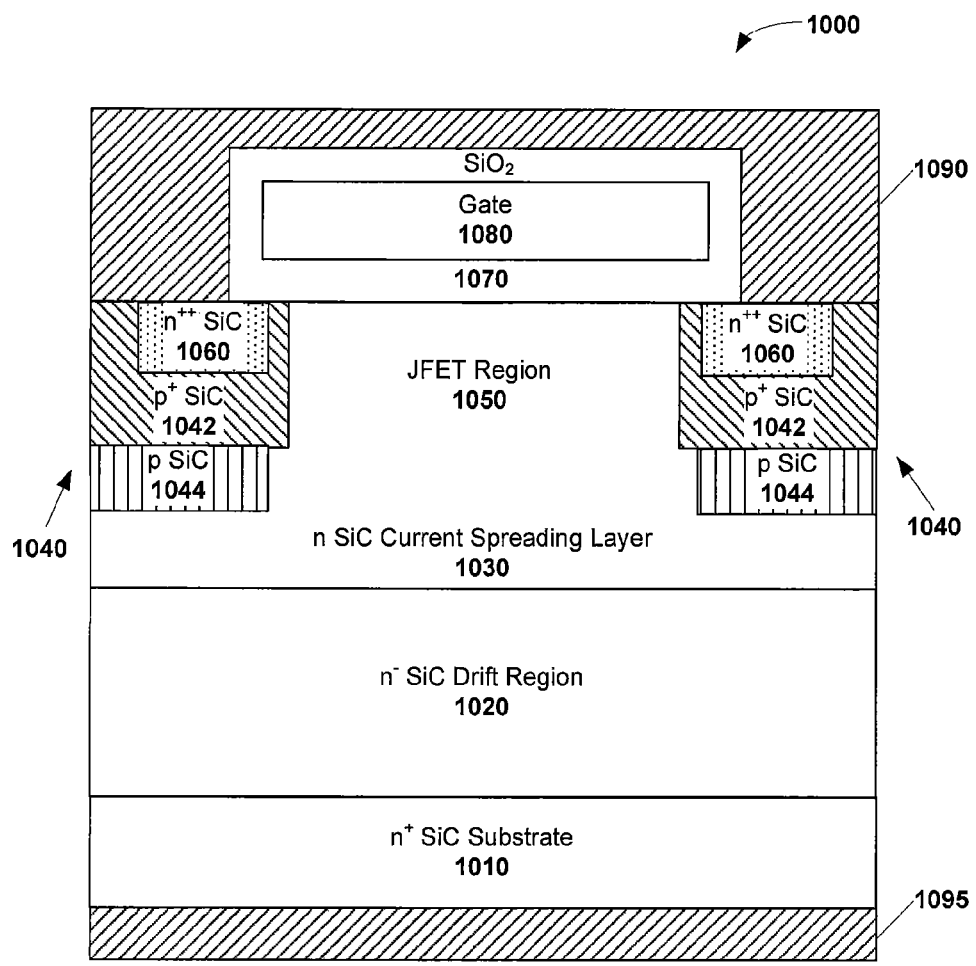
FIG. 27 is a schematic cross-sectional view of a MOSFET according to further embodiments of the present invention.

FIG. 27 is a cross-sectional diagram of a unit cell 1000 of a power MOSFET according to further embodiments of the present invention. As shown in FIG. 27, the unit cell 1000 may be implemented on a heavily-doped (n$^+$) single crystal n-type silicon carbide substrate 1010. A lightly-doped (n$^-$) silicon carbide drift region 1020 is provided on the substrate 1010. The silicon carbide drift region 1020 is typically formed by epitaxilly growth on the silicon carbide substrate 1010. An n-type silicon carbide current spreading layer 1030 is provided on the n$^-$ silicon carbide drift layer 1020. The current spreading layer 1030 may be formed, for example, by epitaxial growth after formation of the n$^-$ silicon carbide drift layer 1020 in order to provide a moderately-doped current spreading layer 1030 that has a doping concentration that exceeds the doping concentration of the more lightly-doped n silicon carbide drift layer 1020. A pair of spaced apart p-type silicon carbide wells 1040 ("p-wells") may then be formed in the upper surface of the n-type current spreading layer 1030. The p-wells 1040 may be formed by implanting p-type ions into upper regions of the n-type current spreading layer 1030 using the above-described multi-step channeled ion implantation techniques. Each p-well 1040 may have a heavily doped upper portion 1042 and a more moderately doped lower portion 1044. An n-type silicon carbide JFET region 1050 may be provided in an upper, central portion of the current spreading layer 1030 between the p-wells 1040, and may be formed by ion implantation.

The upper portion 1042 of each p-well 1040 may be heavily doped. For example, in some embodiments, the upper portion 1042 of each p-well 1040 may have a doping concentration of between $2 \times 10^{17}$ cm$^{-3}$ and $1 \times 10^{20}$ cm$^{-3}$. The lower portion 1044 of each p-well 1040 may have a moderate doping concentration. For example, in some embodiments, the lower portion 1044 of each p-well 1040 may have a doping concentration of between $5 \times 10^{16}$ cm$^{-3}$ and $5 \times 10^{17}$ cm$^{-3}$. The lower portion 1044 of each p-well 1040 may be quasi-charge balanced with the n-type current spreading layer 1030 to form a superjunction structure. This provision of the superjunction structure allows the JFET region 1050 to be more heavily doped without reducing the on-state resistance and without increasing the electric field intensity on the gate oxide. The doping concentration of the JFET region 1050 may, for example, be more than an order of magnitude greater than a doping concentration of the remainder of the current spreading layer 1030.

A heavily-doped (n$^+$) n-type silicon carbide region 1060 is formed within the upper portion 1042 of each p-well 1040. The heavily-doped (n$^+$) n-type silicon carbide regions 1060 act as the source regions for the two individual transistors included in the unit cell 1000, while the current spreading layer 1030, the drift region 1020 and the substrate 1010 together act as a common drain region for the unit cell 1000. A channel region is provided in each p-well 1040 between the source region 1060 and the JFET region 1050. A gate insulating layer 1070 (e.g., a silicon oxide layer) is provided on the JFET region 1050, portions of the p-wells 1040 and portions of the n-type silicon carbide regions 1060. A semiconductor or metal gate electrode 1080 is provided on the gate insulating layer 1070. The gate insulating layer 1070 may surround the gate electrode 1080 in some embodiments.

A source contact 1090 (e.g., a metal layer) is provided on the n$^+$ source regions 1060 that acts as a common source contact, and a drain contact 1095 (e.g., another metal layer) is provided on the back side of the silicon carbide substrate 1000 acts as the common drain contact.

The above-described ion implantation techniques according to embodiments of the present invention may exhibit a number of advantages. As discussed above, the technique may be used to form p-type blocking junctions, p-wells and other implanted regions that have doping profiles that may result in improved device performance. Additionally, the use of channeling doping techniques may result in much higher dopant activation levels, such as levels in excess of 95%, which may provide more consistent and/or repeatable doping and which also may reduce the amount of time required for doping since less dopants are required to achieve a given level of activated dopants.

While in the description above, the example embodiments are described with respect to semiconductor devices that have n-type substrates and channels in n-type portions of the drift layers, it will be appreciated that opposite conductivity type devices may be formed by simply reversing the conductivity of the n-type and p-type layers in each of the above embodiments. Thus, it will be appreciated that the present invention covers both n-type and p-type devices. It will likewise be appreciated that typically each power semiconductor device formed according to the ion implantation techniques disclosed herein will comprise a plurality of individual devices that are disposed in parallel in a unit cell structure.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be, understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A Junction Barrier Schottky ("JBS") diode, comprising:
a drift region having a first conductivity type; and
a plurality of implanted regions having a second conductivity type in an upper portion of the drift region, where the plurality of implanted regions comprise blocking junctions of the JBS diode,
wherein an upper portion of each of the plurality of implanted regions has a first doping concentration and a lower portion of each of the plurality of implanted regions has a second doping concentration,
wherein the first doping concentration is greater than the second doping concentration, and
wherein the lower portion of each of the plurality of implanted regions is quasi-charge balanced with a respective adjacent portion of the drift region to form a superjunction structure in the drift region.

2. The JBS diode of claim 1, wherein the lower portion of each of the plurality of implanted regions has a substantially constant doping profile.

3. The JBS diode of claim 1, wherein the upper portion of each of the plurality of implanted regions extends between about 0.5 and about 1.5 microns into the drift region, and the lower portion of each of the plurality of implanted regions extends for at least 1 micron below its respective upper portion.

4. The JBS diode of claim 3, further comprising a Schottky contact that comprises tantalum.

5. The JBS diode of claim 1, wherein the upper portion of each of the plurality of implanted regions has a doping concentration of at least $5 \times 10^{17}$ cm$^{-3}$.

6. The JBS diode of claim 1, wherein the lower portion of each of the plurality of implanted regions has a doping concentration of between $1 \times 10^{16}$ cm$^{-3}$ and $1$–$10^{17}$ cm$^{-3}$.

7. The JBS diode of claim 1, wherein the first doping concentration is at least 100 times greater than the second doping concentration.

8. The JBS diode of claim 1, wherein the drift region comprises a silicon carbide material, and
wherein a first sidewall of each implanted region extends within +/−1.5° of one of the <11-23>, <−1-123>, <1-213>, <−12-13>, <2-1-13> or <−2113> crystallographic axes of the silicon carbide material of the drift region.

9. The JBS diode of claim 1, wherein each of the plurality of implanted regions having the second conductivity type has a shape that is one of a column shape or a circular shape.

10. The JBS diode of claim 1, wherein the plurality of implanted regions having the second conductivity type are arranged in a checkboard pattern when viewed in plan view.

11. The JBS diode of claim 1, wherein the first doping concentration is at least 1000 times greater than the second doping concentration.

12. The JBS diode of claim 1, wherein the plurality of implanted regions are formed via a channeled ion implantation along the <0001> crystallographic axis.

13. The JBS diode of claim 1, wherein the channel regions are defined in between the blocking junctions.

14. A semiconductor device, comprising:
a drift region comprising silicon carbide;
a plurality of first regions doped with first conductivity type impurities, each of the plurality of first regions having a first sidewall and a second sidewall that are both slanted at a same angle that is between 6° and 35° from a first plane that is normal to a top surface of the drift region; and a plurality of second regions that are doped with second conductivity type impurities that are opposite the first conductivity type impurities and arranged adjacent respective ones of the plurality of first regions, each of the plurality of second regions having a first sidewall that is facing and contacting the first sidewall of a respective one of the plurality of first regions, wherein each of the plurality of first regions comprises an upper portion having a first doping concentration and a lower portion having a second doping concentration that is lower than the first doping concentration, and wherein the lower portion of each of the plurality of first regions is quasi-charge balanced with a respective adjacent one of the plurality of second regions to form a superjunction structure in the drift region.

15. The semiconductor device of claim 14, wherein the plurality of first regions and the plurality of second regions each have a ring shape, the plurality of first regions and the plurality of second regions are alternately arranged to form a plurality of superjunction structures.

16. The semiconductor device of claim 14, wherein the plurality of first regions and the plurality of second regions are alternately arranged in a checkerboard pattern, when viewed in plan, to form a plurality of superjunction structures.

17. The semiconductor device of claim 14, wherein a charge of the lower portion of each of the plurality of first regions is within 20% of a charge of the portions of the plurality of second regions that are between the lower portions of the plurality of first regions.

18. A semiconductor device, comprising:
a drift region comprising silicon carbide;
a plurality of first regions doped with first conductivity type impurities, each of the plurality of first regions having a first sidewall that is slanted at an angle of between 6° and 35° from a first plane that is normal to a top surface of the drift region; and
a plurality of first regions doped with first conductivity type impurities; and
a plurality of second regions that are doped with second conductivity type impurities that are opposite the first conductivity type impurities and arranged adjacent respective ones of the plurality of first regions, each of the plurality of second regions having a first sidewall that is facing and contacting the first sidewall of a respective one of the plurality of first regions,
wherein each of the plurality of first regions comprises an upper portion having a first doping concentration and a lower portion having a second doping concentration that is lower than the first doping concentration, and
wherein the lower portion of each of the plurality of first regions is quasi-charge balanced with a respective adjacent one of the plurality of second regions to form a superjunction structure in the drift region,
wherein the first sidewall of each of the plurality of first regions is slanted at an angle that is +/−1.5° of one of the <11-23>, <−1-123>, <1-213>, <−12-13>, <2-1-13> and <−2113> crystallographic axes.

* * * * *

UNITED STATES PATENT AND TRADEMARK OFFICE
CERTIFICATE OF CORRECTION

PATENT NO. : 11,791,378 B2
APPLICATION NO. : 17/371514
DATED : October 17, 2023
INVENTOR(S) : Van Brunt et al.

It is certified that error appears in the above-identified patent and that said Letters Patent is hereby corrected as shown below:

On the Title Page

Column 2, Line 1, Item (56) References Cited, FOREIGN PATENT DOCUMENTS: Please correct "CN 105118352" to read --CN 105118852--

In the Specification

Column 1, Line 10: Please correct "14/168,310" to read --15/168,310--

Column 21, Line 34: Please correct "$cm^3$" to read --$cm^{-3}$--

In the Claims

Column 34, Line 35, Claim 6: Please correct "$1\text{-}10^{17}\ cm^{-3}$" to read --$1\times10^{17}\ cm^{-3}$--

Column 36, Lines 8-9, Claim 18: Please remove the phrase "a plurality of first regions doped with first conductivity type impurities; and"

Signed and Sealed this
Twenty-third Day of July, 2024

Katherine Kelly Vidal
*Director of the United States Patent and Trademark Office*